United States Patent [19]

Komatsu et al.

[11] Patent Number: 5,744,410
[45] Date of Patent: Apr. 28, 1998

[54] HIGH THERMAL CONDUCTIVE SILICON NITRIDE SINTERED BODY, METHOD OF PRODUCING THE SAME AND PRESS-CONTACTED BODY

[75] Inventors: Michiyasu Komatsu; Kazuo Ikeda; Nobuyuki Mizunoya; Yoshitoshi Sato; Tatsuya Imaizumi; Kazuyuki Kondo, all of Yokohama, Japan

[73] Assignee: Kabushiki Kaisha Toshiba, Kawasaki, Japan

[21] Appl. No.: 700,358

[22] PCT Filed: Jun. 7, 1996

[86] PCT No.: PCT/JP96/01559

§ 371 Date: Oct. 4, 1996

§ 102(e) Date: Oct. 4, 1996

[87] PCT Pub. No.: WO97/00837

PCT Pub. Date: Jan. 9, 1997

[30] Foreign Application Priority Data

Jun. 23, 1995 [JP] Japan ................................ 7-158206
Dec. 28, 1995 [JP] Japan ................................ 7-344237

[51] Int. Cl.$^6$ .................................................. C04B 35/584
[52] U.S. Cl. ................................................. 501/97.2
[58] Field of Search .............................. 501/97, 98, 97.2

[56] References Cited

U.S. PATENT DOCUMENTS

| | | |
|---|---|---|
| 5,089,449 | 2/1992 | Miwa et al. ................................ 501/97 |
| 5,238,884 | 8/1993 | Sakai et al. ................................ 501/97 |
| 5,399,536 | 3/1995 | Yamakawa et al. ....................... 501/97 |
| 5,439,856 | 8/1995 | Komatsu . |
| 5,449,649 | 9/1995 | Li et al. ..................................... 501/97 |
| 5,618,768 | 4/1997 | Higuchi et al. ............................ 501/97 |

FOREIGN PATENT DOCUMENTS

| | | |
|---|---|---|
| 3-218975 | 9/1991 | Japan . |
| 6-135771 | 5/1994 | Japan . |
| 07149588 | 6/1995 | Japan . |

*Primary Examiner*—Karl Group
*Attorney, Agent, or Firm*—Oblon, Spivak, McClelland, Maier, & Neustadt, P.C.

[57] ABSTRACT

A high thermal conductive silicon nitride sintered body of this invention is characterized by containing more than 7.5 wt % to at most 17.5 wt % of a rare earth element in terms of the amount of an oxide thereof, if necessary, at most 1.0 wt % of at least one of aluminum nitride and alumina, if necessary, 0.1–3.0 wt % of at least one compound selected from the group consisting of oxides, carbides, nitrides, silicides and borides of Ti, Zr, Hf, V, Nb, Ta, Cr, Mo and W, and at most 0.3 wt % of Li, Na, K, Fe, Ca, Mg, Sr, Ba, Mn and B as impurity cationic elements in terms of total amount thereof, containing a β-type silicon nitride crystal and a grain boundary phase. The sintered body has a ratio of a crystal compound phase in the grain boundary phase to the entire grain boundary phase of at least 20%, a porosity of at most 2.5% by volume, a thermal conductivity of at least 80 W/m·K and a three-point bending strength of at least 650 MPa at a room temperature.

29 Claims, 2 Drawing Sheets

HIGH THERMAL CONDUCTIVE SILICON NITRIDE SINTERED BODY, METHOD OF PRODUCING THE SAME AND PRESS-CONTACTED BODY

TECHNICAL FIELD

The present invention relates to a high thermal conductive silicon nitride sintered body, a method of producing the same, and a press-contacted body and, more particularly, to a high thermal conductive silicon nitride sintered body which achieves high strength characteristics, high thermal conductivity, and good heat-radiating characteristics, and is preferably used as various semiconductor substrate or press-contacted body, a method of producing the high thermal conductive silicon nitride sintered body, and a press-contacted body.

BACKGROUND ART

A press-contacting heat-radiating plate, joined to a heat-generating part by press contact, for press contact to radiate heat from the heat-generating part out of the system is popularly used in various electronic equipment or electronic devices. A press-contacted body such as a thyristor is popularly used as a semiconductor element having a current control function such as a function of switching a large current or a function of converting AC to DC is also popularly used.

FIG. 2 is a sectional view showing a structure of a thyristor serving as a silicon control rectifier (SCR). This thyristor is constituted by a silicon junction body 3 inserted between a copper stud 1 serving as an anode and a cathode wire 2, a gate wire 4 connected to the silicon junction body 3, a ceramic seal 5 and a case 6 which seal the silicon junction body 3 to shield the silicon junction body 3 from external air, and a planar heat-radiating plate 7 which is in press contact with the copper stud 1 to radiate heat generated in the structure out of the structure. A state across the anode and the cathode is changed from an OFF (cut) state into an ON (start) state by a gate current flowing in the gate wire 4 to control a large current.

In recent years, an amount of heat generated from parts tends to sharply increase in accordance with an increase in integration density and output power of the heat-generating parts, a heat-radiating plate which has good heat-radiating characteristics is strongly demanded. For example, to cope with an increase in electric power demand, a thyristor having a more large capacity is demanded. A heat-radiating plate which can inevitably prevent dielectric breakdown from occurring by heat generation and has excellent heat-radiating characteristics and insulating characteristics is demanded.

As a material constituting the heat-radiating plate 7 for such a thyristor, alumina ($Al_2O_3$) is generally used. However, alumina has poor heat-radiating characteristics because alumina has a low thermal conductivity of about 20 W/m. K, and a heat-radiating plate coping with an increase in output power cannot be easily formed. An aluminum nitride (AlN) sintered body which has a thermal conductivity twice to three times that of alumina and excellent thermal conductivity has been also used as a material constituting a heat-radiating plate.

On the other hand, ceramic sintered bodies containing silicon nitride as a main component have strong heat resistance. They resist temperatures as high as 1,000° C. or higher. Silicon nitride ceramic sintered bodies also have strong thermal shock resistance due to their low thermal expansivity. Because of these characteristics, silicon nitride ceramic sintered bodies are expected to be widely used as high-temperature structural materials, most of which are currently made of heat-resistant super alloys. In fact, silicon nitride ceramic sintered bodies are already used for high-strength heat-resistant components and parts of, for example, gas turbines, engines or steel making machines. Further, because of their high corrosion resistance to metal, some silicon nitride ceramic sintered bodies are applied to melt-resistant material for molten metal. Still further, because of their high abrasion resistance, some silicon nitride ceramic sintered bodies are applied to or tested for cutting tools or sliding parts such as bearings.

Various sintering compositions for silicon nitride ceramic sintered bodies are known: silicon nitride-yttrium oxide-aluminum oxide system; silicon nitride-yttrium oxide-aluminum oxide-aluminum nitride system; and silicon nitride-yttrium oxide-aluminum oxide-oxide of titanium, magnesium or zirconium.

The oxides of rare earth elements, such as yttrium oxide ($Y_2O_3$) in the sintering compositions listed above, have been widely used as sintering assistant agents. Such rare earth element oxides enhance the sintering characteristics of sintering materials and, therefore, achieve high density and high strength of the sintered bodies.

According to the conventional art, silicon nitride sintered bodies are generally mass-produced as follows. After a sintering assistant agent as mentioned above is added to the powder of silicon nitride, the mixture is molded to form a compact. Then, the compact is sintered in a sintering furnace at about 1,600°–1,900° C. for a predetermined period of time followed by cooling in the furnace.

However, though the silicon nitride sintered body produced by the conventional method achieves high mechanical strengths such as toughness, the thermal conductivities thereof are significantly lower than those of aluminum nitride (AlN) sintered bodies, beryllium oxide (BeO) sintered bodies or silicon carbide (SiC) sintered bodies. Therefore, conventional silicon nitride sintered bodies are unsuitable for electronic materials, such as semiconductor substrates, that need good heat-radiating characteristics. Accordingly, the use of silicon nitride sintered body is thus limited.

On the other hand, aluminum nitride sintered bodies have high thermal conductivity and low thermal expansivity, compared with other ceramic sintered bodies. Aluminum nitride sintered bodies are widely used as packaging materials or materials of circuit base boards for semiconductor chips, which have been progressively improved in operational speed, output power, variety of functions and size. However, no conventional aluminum nitride sintered bodies achieve sufficiently high mechanical strengths. Therefore, there is a growing need for a ceramic sintered body having both high thermal conductivity and high strength.

When a heat-radiating plate or a semiconductor substrate containing the ceramic sintered body mentioned above as a main component is to be joined to a heat-generating part by press contact or to be fixed to a packaging board with screws in the assembly step, the heat-radiating plate or the substrate is broken by slight deformation caused by screw pressing pressure or press contact force or impact in handling. As a result, a yield of heat-radiating parts or press-contacted bodies considerably decreases.

When a high voltage is applied as in a heat-radiating plate used in a thyristor, a heat-radiating plate having a thickness which is large to some extent is required to assure predetermined dielectric strength. For this reason, a thermal resistance inevitably increases, and the material cost of the heat-radiating plate disadvantageously increases.

The present invention has been made to cope with the problems and demands mentioned above, and has as the first object of the present invention to provide improvement of a silicon nitride sintered body having a high thermal conductivity and good heat-radiating characteristics, as well as the high strength characteristics generally inherent in silicon nitride sintered body, and a method of producing the silicon nitride sintered body.

It is the second object of the present invention to provide a press-contacted body such as a thyristor using a press contact heat-radiating plate having excellent strength characteristics, excellent thermal conductivity, and dielectric breakdown characteristics which are considerably improved.

DISCLOSURE OF THE INVENTION

To achieve the above objects, the present inventor studied the effects of the types of silicon nitride powder, sintering assistant agent and additives, the amounts thereof used, and the sintering conditions on the characteristics of the final products, that is, the sintered bodies, by performing experiments.

As the results, the experiments provided the following findings. That is, a silicon nitride sintered body having both high strength and high thermal conductivity can be obtained by: adding certain amounts of a rare earth element and at least one compound selected from the group consisting of oxides, carbides, nitrides, silicides and borides of Ti, Zr, Hf, V, Nb, Ta, Cr, Mo and W, and if necessary, alumina and/or aluminum nitride, to a highly-pure fine powder of silicon nitride; molding to form a compact and degreasing the compact; maintaining the compact at a predetermined high temperature for a certain period of time to sinter the compact so as to enhance the density thereof; and then moderately cooling the sintered body at a certain rate.

Further, the following acknowledgement could be obtained. That is, formation of a glass phase (amorphous phase) in the grain boundary phase is effectively suppressed by using a highly pure powder of silicon nitride containing reduced amounts of oxygen and impurity cationic elements, and preparing a silicon nitride molded compact having a reduced thickness before sintering. Thereby, a silicon nitride sintered body having a high thermal conductivity of 80 W/m. K or higher, more preferably, 90 W/m. K or higher can be obtained even if only a rare earth element is added to a silicon nitride material powder.

If a sintered body in a sintering furnace is cooled by switching off the furnace as performed according to the conventional method, the cooling rate is rather high, that is, about 400°–800° C. per hour. An experiment performed by the present inventor provided the following findings. That is, the grain boundary phase in the structure of a silicon nitride sintered body is changed from an amorphous phase to a phase including crystal phases by moderately cooling the sintered body at a rate of 100° C. per hour or lower while controlling the cooling rate, thereby achieving both high strength and high thermal conductivity.

The above-mentioned high thermal conductive silicon nitride sintered body itself is partially applied for a patent by the present inventor, and is disclosed in Japanese Unexamined Patent Publication No. 6-135771 and Japanese Unexamined Patent Publication No. 7-48174. The silicon nitride sintered body described in these patent publications contains 2.0–7.5% by weight of a rare earth element in terms of the amount of an oxide thereof. However, the present inventor improved and studied the silicon nitride sintered body to provide the following findings. That is, when the silicon nitride sintered body contains higher than 7.5% by weight of a rare earth element in terms of the amount of an oxide thereof, the thermal conductivity of the sintered body further increases, and sintering properties are further improved. As a result, the present invention has been completed. In particular, when the rare earth element is a lanthanoid, the effect is conspicuous. In addition, as the characteristics of the fine structure of the sintered body, the ratio of a crystal compound phase in a grain boundary phase to the entire grain boundary phase is 60–70%, the sintered body achieves a high thermal conductivity of 110–120 W/m. K or higher.

Further, the followings was provided. That is, when the above described silicon nitride sintered body which satisfies both high strength and high thermal conductivity is applied to a heat-radiating plate to which a heat-generating part such as a rectifier is joined by press contact so as to form a press-contacted body part such as a thyristor, the toughness and thermal conductivity of the press-contacted body part such as a thyristor can be improved. In particular, fastening cracks in the assembly step for the heat-radiating plate or cracks by adding heat cycles can be effectively suppressed.

The present invention has been achieved on the basis of the above findings. One aspect of the present invention provides a high thermal conductive silicon nitride sintered body characterized by containing: more than 7.5% to at most 17.5% by weight of a rare earth element in terms of the amount of an oxide thereof; and at most 0.3% by weight of Li, Na, K, Fe, Ca, Mg, Sr, Ba, Mn and B as impurity cationic elements in terms of total amount thereof, and having a thermal conductivity of at least 80 W/m. K.

Another aspect of the present invention provides a high thermal conductive silicon nitride sintered body characterized by containing: more than 7.5% to at most 17.5% by weight of a rare earth element in terms of the amount of an oxide thereof; and at most 0.3% by weight of Li, Na, K, Fe, Ca, Mg, Sr, Ba, Mn and B as impurity cationic elements in terms of total amount thereof, comprising a silicon nitride crystal and a grain boundary phase, and having the ratio of a crystal compound phase formed in the grain boundary phase to the entire grain boundary phase of at least 20%.

A further aspect of the present invention provides a high thermal conductive silicon nitride sintered body characterized by containing more than 7.5% to at most 17.5% by weight of a rare earth element in terms of the amount of an oxide thereof, comprising a silicon nitride crystal and a grain boundary phase, and having the ratio of a crystal compound phase formed in the grain boundary phase to the entire grain boundary phase of at least 20% and a thermal conductivity of at least 80 W/m. K. The three-point bending strength of the high thermal conductive silicon nitride sintered body is at least 650 MPa.

Further, the high thermal conductive silicon nitride sintered body preferably comprises a silicon nitride crystal and a grain boundary phase, and has the ratio of a crystal compound phase formed in the grain boundary phase to the entire grain boundary phase of at least 50%.

A lanthanoid is preferably used as the rare earth element to improve the thermal conductivity of the sintered body.

The high thermal conductive silicon nitride sintered body may contain at most 1.0% by weight of aluminum nitride and/or at most 1.0% by weight of alumina. Both at most 1.0% by weight of aluminum nitride and at most 1.0% by weight of alumina may be used together with each other.

The high thermal conductive silicon nitride sintered body used in the present invention preferably contains 0.1–0.3% by weight of at least one element selected from the group consisting of Ti, Zr, Hf, V, Nb, Ta, Cr, Mo and W in terms of the amount of an oxide thereof. The sintered body can contain at least one element selected from the group consisting of Ti, Zr, Hf, V, Nb, Ta, Cr, Mo and W such that the element is -added to the silicon nitride powder as an oxide, carbide, nitride, silicide, or boride.

A high thermal conductive silicon nitride sintered body according to the present invention is produced by the following method. That is, the method characterized by comprising the steps of: forming a compact by molding a mixture obtained by adding more than 7.5% to at most 17.5% by weight of a rare earth element in terms of the amount of an oxide thereof, to a silicon nitride powder which contains at most 1.7% by weight of oxygen, at most 0.3% by weight of Li, Na, K, Fe, Ca, Mg, Sr, Ba, Mn and B as impurity cationic elements in terms of total amount thereof, and at least 90% by weight of alpha-phase type silicon nitride, and which has an average grain size of at most 1.0 μm; degreasing the compact; sintering the compact at a temperature of 1,800°–2,100° C. while pressurizing the atmosphere around the compact to form a sintered body; and moderately cooling the sintered body at a cooling rate of at most 100° C. per hour until the temperature is reduced to a point at which a liquid phase formed of the rare earth element during the sintering step solidifies.

In the above production method, at most 1.0% by weight of at least one of alumina and aluminum nitride is preferably added to the silicon nitride powder.

In addition, 0.1–3.0% by weight of at least one compound selected from the group consisting of oxides, carbides, nitrides, silicides and borides of Ti, Zr, Hf, V, Nb, Ta, Cr, Mo and W is more preferably added to the silicon nitride powder.

According to the above described production method, a grain boundary phase containing a rare earth element and the like in a silicon nitride crystal structure is formed, and a silicon nitride sintered body having both good mechanical characteristics and good thermal conductive characteristics, more specifically, a porosity of at most 2.5% by volume, a thermal conductivity of at least 80 W/m. K, and a three-point bending strength of at least 650 MPa at a room temperature can be obtained.

To achieve good sintering characteristics, high strength and high thermal conductivity of the product, the silicon nitride fine powder which is used in the method of the invention and contained as a main component in the sintered body of the invention contains at most 1.7%, preferably, 0.5–1.5%, by weight of oxygen, at most 0.3%, preferably, 0.2% or less, by weight of Li, Na, K, Fe, Mg, Ca, Sr, Ba, Mn and B as impurity cationic elements in terms of total amount thereof, and at least 90%, more preferably, at least 93%, by weight of alpha-phase type silicon nitride, and, further the powder has fine grains, that is, an average grain size of at most 1.0 μm, more preferably about 0.4–0.8 μm.

The use of a fine powder of silicon nitride having an average grain size of 1.0 μm or less facilitates forming a dense sintered body having a porosity of at most 2.5% by volume without requiring a large amount of a sintering assistant agent, and therefore reduces the potential adverse effect of a sintering assistant agent on the thermal conductivity of the sintered body.

The total amount of the impurity cationic elements contained in the sintered body, that is, Li, Na, K, Fe, Ca, Mg, Sr, Ba, Mn and B, is limited to at most 0.3% by weight in order to ensure the thermal conductivity of at least 80 W/m·K, because the impurity cationic elements adversely affect the thermal conductivity of the sintered body. In particular, for the same reason described above, the total amount of the impurity cationic elements is more preferably set to be at most 0.2% by weight. In this case, since the silicon nitride powder used to obtain an ordinary silicon nitride sintered body contains a relatively large amounts of Fe, Ca and Mg, a total amount of Fe, Ca and Mg is used as a criteria for the total amount of impurity cationic elements.

The use of a silicon nitride powder containing at least 90% by weight of alpha-phase type silicon nitride, which has better sintering characteristics than a beta-phase type, facilitates producing a high-density sintered body.

Examples of the rare earth element to be contained as a sintering assistant agent in a silicon nitride powder are Ho, Er, Yb, Y, La, Sc, Pr, Ce, Nd, Dy, Sm and Gd. Such a rare earth element may be contained in a silicon nitride powder in the form of an oxide thereof or a substance which is changed into an oxide thereof during the sintering process. Two or more kinds of such oxide or substance may be contained in a silicon nitride powder. Among them, holmium oxide ($Ho_2O_3$) and erbium oxide ($Er_2O_3$) are particularly preferred.

In particular, by using Ho, Er and Yb which are lanthanoides as rare earth elements, sintering characteristics are becomes better, and a sintered body having a sufficiently high density can be obtained even in a low-temperature range at about 1,850° C. Therefore, the equipment cost and running cost of the sintering apparatus can be advantageously reduced. Such a sintering assistant agent reacts with the silicon nitride powder so as to form a liquid phase and thereby serves as a sintering promoter.

The amount of a sintering assistant agent to be contained in the material powder is set to be within a range of from more than 7.5% to 17.5% or less by weight in terms of the amount of an oxide thereof. If the amount is 7.5% or less by weight, the sintered body fails to achieve a sufficiently high density and high thermal conductivity. In particular, when an element which has a large atomic weight like lanthanoid is used as the rare earth element, a sintered body having relatively low strength and relatively low thermal conductivity is formed.

On the other hand, if the amount is more than 17.5% by weight, an excessively large portion of the grain boundary phase is formed, thereby reducing the thermal conductivity and strength of the sintered body. For this reason, the amount of a sintering assistant agent is within the range described above. For the same reason described above, the more preferred range of the amount of a sintering assistant agent is 8 to 15% by weight.

The oxides, carbides, nitrides, silicides and borides of Ti, Zr, Hf, V, Nb, Ta, Cr, Mo and W promote the sintering assistant effect of a rear earth element, and promotes dispersion thereof in the crystal structure so as to enhance the mechanical strength of the silicon nitride ($Si_3N_4$) sintered body. Compounds of Hf and Ti are particularly preferred.

If the amount of these compounds contained is less than 0.1% by weight, the sintered body fails to achieve a sufficiently addition effect. If the amount is greater than 3.0% by weight, the thermal conductivity, mechanical strength and electrical breakdown strength of the sintered body are reduced. For this reason, the preferred range of the amount of these compounds contained is 0.1–3.0% by weight, preferably, 0.2–2% by weight.

The above compounds, such as Ti, Zr and Hf, also serve as light blocking agents. More specifically, they color the silicon nitride sintered body black and thus provides it with an opacity. For this reason, a circuit board on which an integrated circuit or the like which tends to malfunction when exposed to light is packaged is to be manufactured, the compounds of Ti and the like are preferably added to the silicon nitride powder so as to form a silicon nitride substrate having excellent light blocking characteristics.

In the present invention, alumina ($Al_2O_3$) serving as another selective additive component assists the effect of the sintering assistant agent, and performs a conspicuous effect, in particular, when the press-sintering process is performed. If the amount of $Al_2O_3$ added to a silicon nitride powder is less than 0.1% by weight, the sintering process must be performed at a more higher temperature. On the other hand, if the amount is greater than 1.0% by weight, an excessively large portion of the grain boundary phase is formed, the compound starts dissolving into the silicon nitride and, therefore, reduces the thermal conductivity of the sintered body. Therefore, the amount of compound must be set to at most 1% by weight, preferably, within a range of 0.1–0.75% by weight. In particular, to achieve good performance as well as high strength and high thermal conductivity, the amount of the compound is preferably within a range of 0.1–0.5% by weight.

When $Al_2O_3$ is used together with AlN, the total amount of $Al_2O_3$ and AlN is preferably set to 1.0% by weight.

Aluminum nitride (AlN) serving as another additive component suppresses evaporation of silicon nitride or the like in the sintering process, and assists the effect of the rare earth element as a sintering promoter.

If the amount of AlN added to a silicon nitride powder is less than 0.1% by weight (less than 0.05% by weight when AlN is used together with alumina), the sintering process must be performed at a more higher temperature. On the other hand, if the amount is greater than 1.0% by weight, an excessively large portion of the grain boundary phase is formed, the compound starts dissolving into the silicon nitride and, therefore, reduces the thermal conductivity of the sintered body. Therefore, the amount of compound is preferably set to a range of 0.1–0.5% by weight. In particular, to achieve good performance such as good sintering characteristics, high strength and high thermal conductivity, the amount of the compound is preferably within a range of 0.1–0.5% by weight. If AlN is used together with $Al_2O_3$, the amount of AlN to be added is preferably set to a range of 0.05–0.5% by weight.

Silicon carbide (SiC) may be added to a silicon nitride powder to improve the thermal conductivity of the sintered body. However, if an amount of SiC to be added exceeds 3% by weight, the insulating characteristics of the sintered body is reduced, and the effect of the sintered body used as a semiconductor substrate or a heat-radiating plate for a thyristor is reduced. Therefore, the amount is preferably set to 3% or less by weight.

Since the porosity of a sintered body significantly affects the thermal conductivity and strength of the sintered body, the porosity is preferably set to 2.5% or less. If it is greater than 2.5% by volume, the sintered body fails to achieve high thermal conductivity, and the thermal conductivity and strength of the sintered body are reduced to undesired levels.

Although a silicon nitride sintered body is structurally constituted by a silicon nitride crystal phase and a grain boundary phase, the ratio of the crystal compound phase to the grain boundary phase significantly affects the thermal conductivity of the sintered body. The ratio of the crystal compound phase to the grain boundary phase must be set to 20% or higher, more preferably, 50% or higher. If the ratio is less than 20%, the sintered body fails to achieve a thermal conductivity of at least 80 W/m·K and, therefore, good heat-radiating characteristics and a desirable high-temperature strength.

To ensure that the porosity of the silicon nitride sintered body is limited to at most 2.5% by volume and the ratio of a crystal phase formed in the grain boundary phase to the entire grain boundary phase becomes at least 20%, it is important that a silicon nitride molded compact must be press-sintered at 1,800°–2,100° C. for about 2–10 hours immediately followed by cooling the sintered body at a rate of 100° C. per hour or slower.

If the sintering temperature is lower than 1,800° C., the sintering body fails to achieve a sufficiently high density; more specifically, the porosity becomes greater than 2.5 vol %, thereby reducing both the mechanical strength and thermal conductivity of the sintered body to undesired levels. If the sintering temperature is higher than 2,100° C., the silicon nitride per se becomes likely to evaporate or decompose. In particular, if no press-sintering process is performed but the sintering process is performed under the normal pressure, the decomposition and evaporation of the silicon nitride may occur at about 1,800° C.

The rate of cooling a sintered body immediately upon completion of the sintering operation is an important control factor to achieve crystallization of the grain boundary phase. If the sintered body is rapidly cooled at a cooling rate higher than 100° C. per hour, the grain boundary phase of the sintered body structure becomes an amorphous phase (a glass phase) and, therefore, the ratio of a crystal phase formed of the liquid phase to the entire grain boundary phase becomes less than 20%. Thereby, the strength and thermal conductivity of the sintered body are reduced to undesired levels.

The sufficiently broad temperature range in which the cooling rate must be precisely controlled is from a predetermined sintering temperature (1,800°–2,100° C.) to the solidifying point of the liquid phase formed by the reaction of the sintering assistant agent as described above. The liquid phase solidifies at about 1,600°–1,500° C. if the sintering assistant agent as described above is used. By maintaining the cooling rate at 100° C. per hour or slower, preferably, 50° C. per hour or slower, more preferably, 25° C. per hour or slower, at least in a temperature range from the sintering temperature to the solidifying point of the liquid phase, 20% or more, preferably, 50% or more, of the grain boundary becomes a crystal phase, thus achieving a sintering body having both high mechanical strength and high thermal conductivity.

A silicon nitride sintered body according to the present invention can be produced by, for example, the following processes. A material mixture is prepared by adding predetermined amount of a sintering assistant agent, a required additive, such as an organic binder, and $Al_2O_3$, AlN, and/or a compound of Ti, to a fine powder of silicon nitride which has a predetermined average grain size and contains very small amount of impurities. The material mixture is then molded into a compact having a predetermined shape. As a method of molding the material mixture, a conventional sheet molding method, such as the die-press method or the doctor-blade method can be applied.

After the molding process, the molding compact is maintained at 600°–800° C. for 1–2 hours in a non-oxidizing atmosphere or at 400°–500° C. for 1–2 hours in the air, thereby degreasing the compact, that is, thoroughly removing the organic binder added in the material mixture preparing process. The degreased compact is sintered at 1,800°–2,100° C. in an atmosphere of an inert gas, such as nitrogen gas or argon gas while being pressured by the atmosphere gas.

The silicon nitride sintered body produced by the above method achieves a porosity of 2.5% or less, a thermal conductivity of 80 W/m·K (at 25° C.) or greater, preferably, 90 W/m·K or greater, and good mechanical characteristics, that is, a three-point bending strength of 650 MPa or greater.

A silicon nitride sintered body which is formed by adding SiC or the like having high thermal conductivity to silicon nitride having low thermal conductivity to have a thermal conductivity of 80 W/m·K or greater is not included in the claims. However, a silicon nitride based sintered body which is formed by combining SiC or the like having high thermal conductivity to a silicon nitrate sintered body having a thermal conductivity of 80 W/m·K or greater is included in the claims of the present invention as a matter of course.

A press-contacted body according to the second aspect is an invention obtained by applying a high thermal conductive silicon nitride sintered body including a high thermal conductive silicon nitride sintered body according to the first aspect, to a press-contacted body. More specifically, the press-contacted body is characterized in that a heat-generating part is press-contacted to a heat-radiating plate consisting of a high thermal conductive silicon nitride sintered body containing 2.0–17.5% by weight of a rare earth element in terms of the amount of an oxide thereof and at most 0.3% by weight of Li, Na, K, Fe, Ca, Mg, Sr, Ba, Mn and B as impurity cationic elements in terms of total amount thereof, and having a thermal conductivity of at least 90 W/m·K. The high thermal conductive silicon nitride sintered body used in this case does not always coincide with the high thermal conductive silicon nitride sintered body according to the first aspect, as a matter of course. Contents defined in the respective claims are the spirit and scope of the invention.

A Press-contacted body according to the second aspect may be constituted by a heat-generating part is press-contacted to a heat-radiating plate consisting of a high thermal conductive silicon nitride sintered body containing 2.0–17.5% by weight of a rare earth element in terms of the amount of an oxide thereof, comprising a silicon nitride crystal and a grain boundary phase, and having a ratio of a crystal compound phase formed in the grain boundary phase to the entire grain boundary phase of at least 20% and a thermal conductivity of at least 90 W/m·K.

Further, the surface roughness of the press-contact surface of the high thermal conductive silicon nitride sintered body (heat-radiating plate) press-contacted to the heat-generating part or the like is preferably set to 10 μm or less with reference to the maximum height (Rmax). When the surface roughness of the press-contact surface of the high thermal conductive silicon nitride sintered body is set to 10 μm or less with reference to Rmax, heat from the heat-generating part can be effectively rendered conductive to the high thermal conductive silicon nitride sintered body without substantially decreasing the contact area between the high thermal conductive silicon nitride sintered body and the heat-generating part. For the same reason as described above, the surface roughness of the press-contact surface is preferably set to 5 μm or less.

According to the press-contacted body of the present invention, since the heat-radiating plate consists of a high thermal conductive silicon nitride sintered body having considerably improved thermal conductivity in addition to the high-strength and high-toughness characteristics generally inherent in silicon nitride sintered body, fastening cracks in the assembly step for the heat-radiating plate, a press-contacted body such as a thyristor using the heat-radiating plate can be mass-produced at a high production yield.

Cracks are rarely formed in the heat-radiating plate by a heat cycle from the heat-generating part because the silicon nitride sintered body has high toughness. For this reason, a press-contacted body such as a thyristor in which heat-cycle resistance characteristics are considerably improved, and a press-contacted body having good durability and reliability can be provided.

Since a silicon nitride sintered body having high thermal conductivity which is not conventionally achieved is used as a heat-radiating plate, the heat-radiating plate exhibits excellent heat-radiating characteristics with small degradation of heat resistance characteristics even if a heat-generating part which points to high output power and high-density integration is press-contacted to the heat-radiating plate.

In particular, the silicon nitride sintered body itself has high mechanical strength, when required mechanical strength characteristics are kept constant, the heat-radiating plate consisting of the silicon nitride sintered body can have a thickness smaller than that of a heat-radiating plate consisting of another ceramic sintered body. Because the thickness of the heat-radiating plate can be reduced, the heat resistance value can be further reduced, and the heat-radiation characteristics can be more improved. Since a heat-radiating plate which is thinner than a conventional heat-radiating plate can achieve required mechanical characteristics, heat-generating parts can be packaged at a high density, thereby reducing a press-contacted body in size.

BEST MODE FOR CARRYING OUT THE INVENTION

Figure 1:
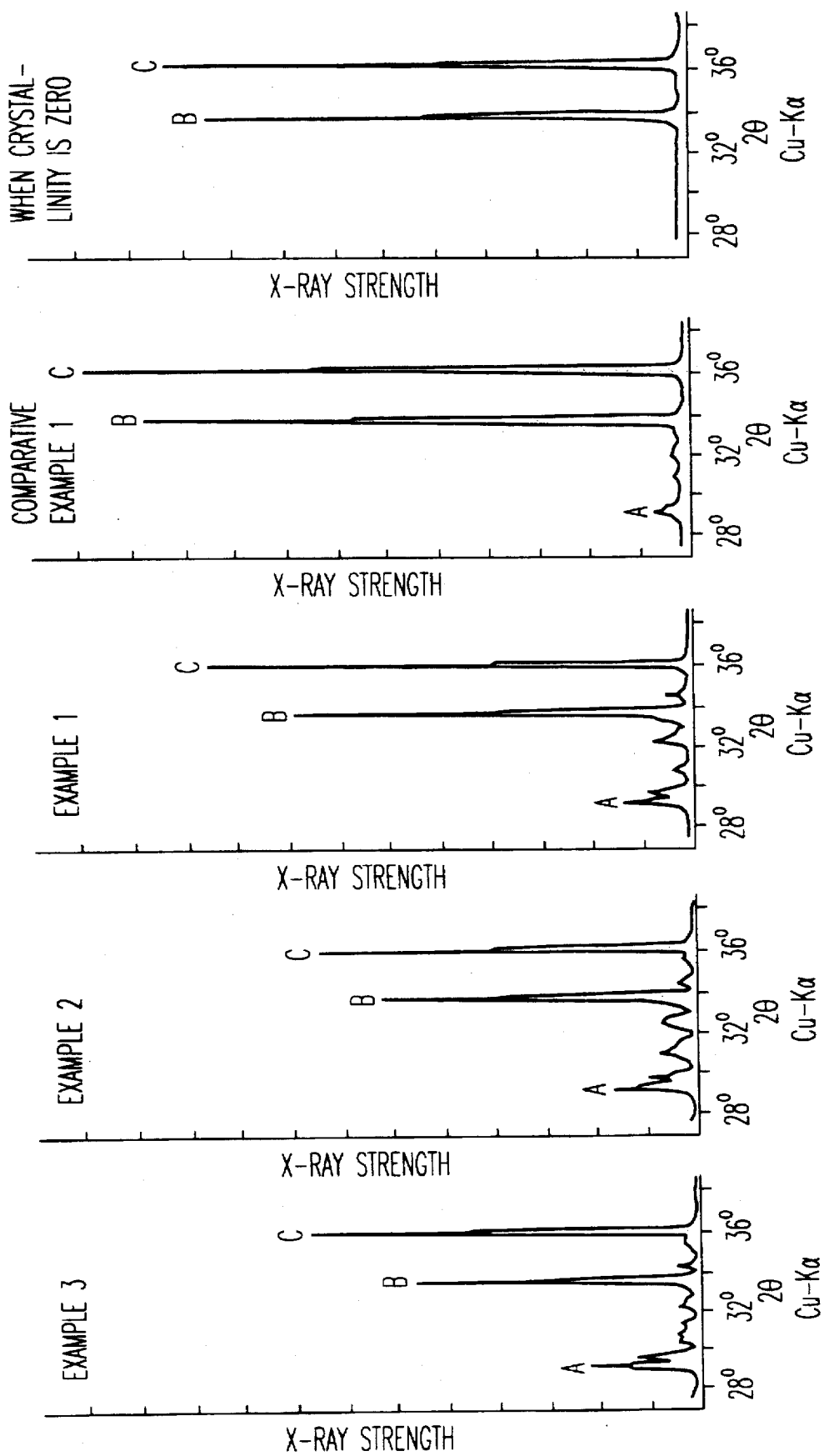
FIGS. 1(A)), 1(B), 1(C) and 1(D) are X-ray diffraction views of sintered bodies according to Examples 3, 2 and 1 and Comparative Example 1, respectively.
FIG. 1(E) is an X-ray diffraction view of a sintered body in which the crystallinity of a grain boundary phase is zero.
Figure 2:
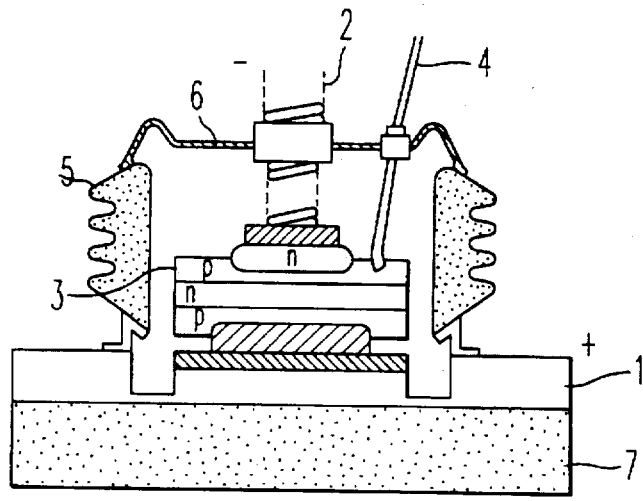
FIG. 2 is a sectional view showing a structure of a thyristor serving as a press-contacted body using a silicon control rectifier.

The embodiments of the present invention will be described below with reference to Examples described below.

EXAMPLES 1–3

12.5% by weight of $Ho_2O_3$ (holmium oxide) powder as a sintering assistant agent having an average grain size of 0.9 μm were added to a silicon nitride material powder containing 1.3% by weight of oxygen, 0.15% by weight of Li, Na, K, Fe, Ca, Mg, Sr, Ba, Mn and B as impurity cationic elements in terms of total amount thereof and 97% by weight of alpha-phase type silicon nitride, and having an average grain size of 0.55 μm. The above-described mixture was wet-blended in ethyl alcohol for 72 hours by using a silicon nitride ball and then dried to obtain a material mixture powder.

A predetermined amount of an organic binder was added to the material mixture powder, and then homogeneously mixed. The mixture was then press-molded under a molding pressure of 1,000 kg/cm² to obtain a plurality of molded compacts each having a size of 50 mm (length)×50 mm (width)×5 mm (thickness). After the compacts were degreased in the atmosphere gas at 700° C. for 2 hours, the compacts were sintered to enhance the density thereof, in the following manner. The degreased compacts were maintained at 1,950° C. for 6 hours in a nitrogen gas atmosphere at 9 atom to form sintered bodies. While the sintered bodies were moderately cooled, the cooling rates were determined at 100° C./hr (Example 1), 50° C./hr (Example 2) and 25° C./hr (Example 3) by controlling the power supplied to the heating devices provided in sintering furnaces until the temperature inside the furnaces reached 1,500° C. Silicon nitride ceramic sintered bodies of Examples 1–3 were thus prepared.

Comparative Example 1

A silicon nitride sintered body of Comparative Example 1 was prepared under generally the same conditions as in Example 1, except that immediately after the sintering process is completed to enhance the density of the sintered body, the heating device was powered off to cool the sintered body at a cooling rate (about 500° C./hr) as performed by the conventional furnace cooling method.

Comparative Example 2

A silicon nitride sintered body of Comparative Example 2 was prepared under generally the same conditions as in Example 1, except for using a silicon nitride material powder having an average grain size of 0.60 μm and containing 1.5% by weight of oxygen, 0.6% by weight of the impurity cationic elements in terms of total amount thereof and 93% by weight of alpha-phase type silicon nitride.

Comparative Example 3

A silicon nitride sintered body of Comparative Example 3 was prepared under generally the same conditions as in Example 1, except for using a silicon nitride material powder having an average grain size of 1.2 μm and containing 1.7% by weight of oxygen, 0.7% by weight of the impurity cationic elements in terms of total amount thereof and 91% by weight of alpha-phase type silicon nitride.

The silicon nitride sintered bodies of Examples 1–3 and Comparative Examples 1–3 were examined to determine their porosities, thermal conductivities (at 25° C.), and three-bending strengths at a room temperature. Further, X-ray analysis of each sintered body was performed to determine the ratio of the crystal phase to the grain boundary phase. The results shown in Table 1 were obtained.

The ratios of the crystal phase to the boundary phase in Table 1 are calculated by the X-ray diffraction patterns of the sintered bodies. FIGS. 1(A), 1(B), 1(C) and 1(D) are X-ray diffraction views of the sintered bodies according to Examples 3, 2 and 1 and Comparative Example 1, respectively.

In these drawings, an X-ray strength peak A representing an amount of crystal compound existing in $Si_3N_4$ and $Ho_2O_3$, an X-ray strength peak B of (101) plane of $\beta$-$Si_3N_4$ and an X-ray strength peak C of (201) plane of $\beta$-$Si_3N_4$ appear. On the other hand, FIG. 1(E) is an X-ray diffraction view of a sintered body in which a grain boundary phase is amorphous and crystallinity is zero. No peak A corresponding to a crystal compound phase appears in FIG. 1(E).

In this case, if the X-ray strength values of the peaks A, B and C are respectively represented by IA, IB and IC, a crystallinity Rs obtained when a grain boundary phase is entirely crystallized in a silicon nitride sintered body prepared by adding 12.5% by weight of $Ho_2O_3$ to silicon nitride is given by equation (1) described below. The crystallinity Rs is 0.45.

$$Rs=IC/(IA+IB)/2 \tag{1}$$

On the other hand, the X-ray strength values of the peaks A, B and C in the X-ray diffraction views are read, and the crystallinities R of the sintered bodies of Examples 1–3 and Comparative Example 1 are calculated according to equation (1), the following results are given:
Example 1. R=12.5/(77+95)/2=0.145
Example 2. R=17 /(62+74)/2=0.248
Example 3. R=22 /(55+75)/2=0.338
Comparative Example 1. R=5/(106+118)/2=0.045

The ratios (%) of the crystallinities R obtained as described above to the crystallinity Rs (=0.45) obtained when 100% of grain boundary phase is crystallized as expressed in equation (2). In this manner, the ratios of crystal phases to grain boundary phases of the sintered bodies are calculated as shown in Table 1, that is, 32%, 55%, 75% and 10%.

$$Q(\%)=R/Rs\times 100 \tag{2}$$

As is apparent from the results shown in Table 1, the silicon nitride sintered bodies of Examples 1–3, which were cooled at rates lower than the cooling rate in Comparative Example 1 immediately after the density-enhancing sintering process, had crystal phases formed in the grain boundary phases. A silicon nitride sintered body having a higher ratio of the crystal phase to the grain boundary phase was used to obtain a high-strength sintered body having high thermal conductivity and good heat-radiation characteristics.

TABLE 1

| Sample | Cooling Rate until 1500° C. after Sintering (°C./hr) | Porosity (%) | Crystal Phase Ratio to Grain Boundary Phase (%) | Thermal Conductivity (W/m · K) | Three-Point Bending Strength (MPa) |
|---|---|---|---|---|---|
| Example 1 | 100 | 0.7 | 32 | 98 | 820 |
| Example 2 | 50 | 0.6 | 55 | 103 | 800 |
| Example 3 | 25 | 0.4 | 75 | 110 | 710 |
| Comparative Example 1 | 500 | 0.8 | 10 | 78 | 860 |
| Comparative Example 2 | 100 | 0.6 | 2 | 60 | 815 |
| Comparative Example 3 | 100 | 4.0 | 3 | 56 | 640 |

On the other hand, when the cooling rate of a sintered body was set to be high to rapidly cool the sintered temperature as in Comparative Example 1, a ratio of crystal phase in the grain boundary phase was 10% or less, and the thermal conductivity was reduced to an undesired level. When a silicon nitride material powder containing a large amount of impurity cationic elements, that is, 0.6% by weight, was used as in Comparative Example 2, almost grain boundary phase was amorphous although the cooling rate was the same as in Example 1, thereby reducing the thermal conductivity.

When a coarse silicon nitride powder having an average grain size of 1.2 μm was used as in Comparative Example 3, a density was insufficiently enhanced in the sintering process. Both the strength and thermal conductivity of the sintered body of Comparative Example 3 were reduced to undesired levels.

EXAMPLES 4–17 AND COMPARATIVE EXAMPLES 4–7

Material mixtures of Examples 4–17 were prepared by varying the amounts of the same silicon nitride material powder and $Ho_2O_3$ powder as used in Example 1 to obtain compositions shown in Table 2.

After the material mixture were molded to form compacts and degrease the compacts under generally the same conditions as in Example 1, the degreased compacts were sintered under the conditions as shown in Table 2. The silicon nitride ceramic sintered bodies of Examples 4–17 were thus prepared.

The material mixtures of Comparative Examples 4–6 were respectively prepared as indicated in Table 2. More specifically, an excessive amount of $Ho_2O_3$ was added (Comparative Example 4), an excessively small amount of $Ho_2O_3$ was added (Comparative Example 5), and an excessive amount of $Ho_2O_3$ was added (Comparative Example 6). The material mixtures were processed under generally the same conditions as in Example 1, thus obtaining the silicon nitride sintered bodies of Comparative Examples 4–6.

The silicon nitride sintered body of Comparative Example 7 was prepared from a material mixture by a sintering operation under generally the same conditions as in Example 1, except that a sintering temperature was set to 1,750° C.

The porosities, thermal conductivities (at 25° C.), three-point bending strengths at a room temperature and crystal phase-to-grain boundary phase proportions (by X-ray analysis) of the silicon nitride ceramic sintered bodies according to Examples 4–17 and Comparative Examples 4–7 produced as described above were measured under the same conditions as in Example 1. The results shown in Table 2 were obtained.

TABLE 2

| Sample | Composition (wt %) | | Sintering Condition Temperature × Time (°C.) × (hr) | Cooling Rate until 1500° C. after Sintering (°C./hr) | Porosity (%) | Crystal Phase Ratio to Grain Boundary Phase (%) | Thermal Conductivity (W/m · K) | Three-Point Bending Strength (MPa) |
|---|---|---|---|---|---|---|---|---|
| | $Si_3N_4$ | $Ho_2O_3$ | | | | | | |
| Ex. 4 | 92 | 8 | 1950 × 6 | 100 | 0.2 | 22 | 89 | 845 |
| Ex. 5 | 92 | 8 | 1950 × 6 | 50 | 0.1 | 28 | 92 | 820 |
| Ex. 6 | 92 | 8 | 1900 × 6 | 50 | 0.6 | 34 | 95 | 800 |
| Ex. 7 | 90 | 10 | 1950 × 6 | 100 | 0.5 | 25 | 95 | 820 |
| Ex. 8 | 90 | 10 | 1950 × 6 | 25 | 0.3 | 65 | 99 | 705 |
| Ex. 9 | 90 | 10 | 1900 × 6 | 25 | 0.9 | 67 | 104 | 805 |
| Ex. 10 | 87.5 | 12.5 | 1975 × 6 | 50 | 0.4 | 69 | 114 | 760 |
| Ex. 11 | 87.5 | 12.5 | 1900 × 6 | 25 | 1.2 | 70 | 105 | 795 |
| Ex. 12 | 85 | 15 | 1950 × 6 | 100 | 1.2 | 40 | 102 | 780 |
| Ex. 13 | 85 | 15 | 2000 × 6 | 100 | 0.6 | 35 | 108 | 700 |
| Ex. 14 | 85 | 15 | 1950 × 6 | 25 | 1.0 | 65 | 120 | 730 |
| Ex. 15 | 82.5 | 17.5 | 1950 × 6 | 100 | 2.3 | 30 | 90 | 755 |
| Ex. 16 | 82.5 | 17.5 | 2000 × 6 | 100 | 1.8 | 28 | 96 | 700 |
| Ex. 17 | 82.5 | 17.5 | 2000 × 6 | 25 | 1.4 | 32 | 100 | 680 |
| C. Ex. 4 | 93 | 7 | 1950 × 6 | 100 | 0.2 | 18 | 78 | 850 |
| C. Ex. 5 | 80 | 20 | 1950 × 6 | 100 | 8.5 | 30 | 62 | 535 |
| C. Ex. 6 | 80 | 20 | 2000 × 6 | 100 | 2.0 | 32 | 78 | 630 |
| C. Ex. 7 | 87.5 | 12.5 | 1750 × 6 | 100 | 8.0 | 30 | 55 | 540 |

As is apparent from the results shown in Table 2, the sintered bodies of Examples 4–17, which contained a predetermined amount of $Ho_2O_3$, and which were cooled at predetermined cooling rates after the sintering process, achieved sufficiently high strengths and high thermal conductivities.

On the other hand, the sintered bodies of Comparative Examples 4–6, in each of which an excessively small amount or excessive amount of the $Ho_2O_3$ component was added, failed to achieve a sufficiently high density, a high three-point bending strength, and high thermal conductivity because the grain boundary phase was excessive or a crystal phase-to-grain boundary phase proportion was excessively low. The sintered body of Comparative Example 7, in which the sintering temperature was set to 1,750° C., failed to achieve a sufficiently high density, and had strength and thermal conductivity which were undesirably reduced.

EXAMPLES 18–48

Silicon nitride ceramic sintered bodies of Examples 18–48 were prepared under generally the same conditions as in Example 1, except that the oxides of rare earth elements having compositions as shown in Table 3 were used instead of the $Ho_2O_3$ powder used in Example 1.

The porosities, thermal conductivities (at 25° C.), three-point bending strengths at a room temperature and crystal phase-to-grain boundary phase proportions (by X-ray analysis) of the sintered bodies according to Examples 18–48 produced as described above were measured under the same conditions as in Example 1. The results shown in Table 3 were obtained.

TABLE 3

| Sample | Oxide of Rare Earth Element Substituted for Ho$_2$O$_3$ (wt %) | Porosity (%) | Crystal Phase Ratio to Grain Boundary Phase (%) | Thermal Conductivity (W/m · K) | Three-Point Bending Strength (MPa) |
|---|---|---|---|---|---|
| Example 18 | Er$_2$O$_3$ | 8 | 0.1 | 30 | 88 | 820 |
| Example 19 | Er$_2$O$_3$ | 10 | 0.1 | 40 | 92 | 805 |
| Example 20 | Er$_2$O$_3$ | 12.5 | 0.2 | 45 | 105 | 800 |
| Example 21 | Er$_2$O$_3$ | 15 | 0.4 | 58 | 118 | 794 |
| Example 22 | Er$_2$O$_3$ | 17.5 | 0.7 | 42 | 100 | 700 |
| Example 23 | Yb$_2$O$_3$ | 8 | 0.2 | 35 | 90 | 800 |
| Example 24 | Yb$_2$O$_3$ | 10 | 0.3 | 45 | 102 | 765 |
| Example 25 | Yb$_2$O$_3$ | 12.5 | 0.5 | 52 | 108 | 730 |
| Example 26 | Yb$_2$O$_3$ | 15 | 0.9 | 60 | 109 | 675 |
| Example 27 | Dy$_2$O$_3$ | 10 | 0.2 | 41 | 87 | 750 |
| Example 28 | Dy$_2$O$_3$ | 12.5 | 0.5 | 49 | 95 | 736 |
| Example 29 | Dy$_2$O$_3$ | 15 | 1.9 | 55 | 102 | 700 |
| Example 30 | PreO$_{11}$ | 8 | 0.1 | 29 | 85 | 700 |
| Example 31 | PreO$_{11}$ | 10 | 0.4 | 38 | 90 | 720 |
| Example 32 | PreO$_{11}$ | 15 | 0.5 | 50 | 99 | 750 |
| Example 33 | CeO$_2$ | 10 | 0.1 | 30 | 90 | 725 |
| Example 34 | CeO$_2$ | 12.5 | 0.2 | 40 | 99 | 755 |
| Example 35 | CeO$_2$ | 15 | 0.8 | 52 | 103 | 750 |
| Example 36 | Sm$_2$O$_3$ | 8 | 0.4 | 27 | 84 | 800 |
| Example 37 | Sm$_2$O$_3$ | 10 | 1.8 | 38 | 90 | 725 |
| Example 38 | Nd$_2$O$_3$ | 8 | 0.4 | 26 | 88 | 700 |
| Example 39 | Nd$_2$O$_3$ | 10 | 0.8 | 38 | 92 | 680 |
| Example 40 | Gd$_2$O$_3$ | 8 | 0.2 | 29 | 88 | 795 |
| Example 41 | Gd$_2$O$_3$ | 10 | 0.3 | 40 | 100 | 750 |
| Example 42 | Gd$_2$O$_3$ | 15 | 1.0 | 49 | 95 | 695 |
| Example 43 | Y$_2$O$_3$ | 8 | 1.4 | 30 | 86 | 690 |
| Example 44 | Y$_2$O$_3$ | 10 | 2.0 | 50 | 90 | 670 |
| Example 45 | Er$_2$O$_3$ Y$_2$O$_3$ | 6.5 3.5 | 1.0 | 48 | 110 | 795 |
| Example 46 | Yb$_2$O$_3$ Y$_2$O$_3$ | 6.5 3.5 | 0.8 | 45 | 108 | 70 |
| Example 47 | Dy$_2$O$_3$ CeO$_2$ | 6 6 | 0.3 | 36 | 105 | 800 |
| Example 48 | Pr$_6$O$_{11}$ Y$_2$O$_3$ | 6.5 3.5 | 1.0 | 40 | 10 | 850 |

As is apparent from the results shown in Table 3, the sintered bodies according to Examples 18–48 employing other rare earth elements instead of Ho$_2$O$_3$ achieved generally the same functions as those of the sintered bodies employing Ho$_2$O$_3$.

EXAMPLES 49–60 AND COMPARATIVE EXAMPLES 8–11

Material mixtures of Examples 49–60 were prepared by varying the amounts of the same silicon nitride material powder, Ho$_2$O$_3$ powder and Al$_2$O$_3$ powder as used in Example 1 to obtain compositions shown in Table 4.

After the material mixture were molded to form compacts and degrease the compacts under generally the same conditions as in Example 1, the degreased compacts were sintered under the conditions as shown in Table 4. The silicon nitride ceramic sintered bodies of Examples 49–60 were thus prepared.

The material mixtures of Comparative Examples 8–11 were respectively prepared as indicated in Table 4. More specifically, an excessive amount of Ho$_2$O$_3$ was added (Comparative Example 8), an excessively small amount of Ho$_2$O$_3$ was added (Comparative Example 9), an excessive amount of Al$_2$O$_3$ was added (Comparative Example 10), and an excessive amount of Ho$_2$O$_3$ (Comparative Example 11). The material mixtures were sintered under generally the same conditions as in Example 1, thus obtaining the silicon nitride sintered bodies of Comparative Examples 8–11.

The porosities, thermal conductivities (at 25° C.), three-point bending strengths at a room temperature and crystal phase-to-grain boundary phase proportions (by X-ray analysis) of the silicon nitride ceramic sintered bodies according to Examples 4–17 and Comparative Examples 4–7 produced as described above were measured under the same conditions as in Example 1. The results shown in Table 4 were obtained.

TABLE 4

| Sample | Composition (wt %) | | | Sintering Condition Temperature × Time (°C.) × (hr) | Cooling Rate until 1500° C. after Sintering (°C./hr) | Porosity (%) | Crystal Phase Ratio to Grain Boundary Phase (%) | Thermal Conductivity (W/m · K) | Three-Point Bending Strength (MPa) |
|---|---|---|---|---|---|---|---|---|---|
| | Si$_3$N$_4$ | Ho$_2$O$_3$ | Al$_2$O$_3$ | | | | | | |
| Ex. 49 | 91.9 | 8 | 0.1 | 1950 × 6 | 50 | 0.1 | 25 | 86 | 855 |
| Ex. 50 | 91.5 | 8 | 0.5 | 1900 × 6 | 25 | 0.1 | 20 | 81 | 950 |
| Ex. 51 | 89.9 | 10 | 0.1 | 1950 × 6 | 100 | 0.5 | 40 | 92 | 800 |
| Ex. 52 | 89.5 | 10 | 0.5 | 1900 × 6 | 25 | 0.1 | 22 | 86 | 850 |

TABLE 4-continued

| Sample | Composition (wt %) | | | Sintering Condition Temperature × Time (°C.) × (hr) | Cooling Rate until 1500° C. after Sintering (°C./hr) | Porosity (%) | Crystal Phase Ratio to Grain Boundary Phase (%) | Thermal Conductivity (W/m · K) | Three-Point Bending Strength (MPa) |
|---|---|---|---|---|---|---|---|---|---|
| | $Si_3N_4$ | $Ho_2O_3$ | $Al_2O_3$ | | | | | | |
| Ex. 53 | 87.4 | 12.5 | 0.1 | 1950 × 6 | 100 | 0.7 | 50 | 105 | 780 |
| Ex. 54 | 87.25 | 12.5 | 0.25 | 1900 × 6 | 50 | 0.3 | 41 | 99 | 805 |
| Ex. 55 | 87 | 12.5 | 0.5 | 1900 × 6 | 50 | 0.2 | 35 | 94 | 845 |
| Ex. 56 | 86.75 | 12.5 | 0.75 | 1900 × 6 | 25 | 0.1 | 25 | 86 | 900 |
| Ex. 57 | 84.75 | 15 | 0.25 | 1950 × 6 | 50 | 0.9 | 42 | 98 | 805 |
| Ex. 58 | 84.5 | 15 | 0.5 | 1900 × 6 | 50 | 0.4 | 36 | 94 | 840 |
| Ex. 59 | 84.25 | 15 | 0.75 | 1900 × 6 | 25 | 0.2 | 23 | 85 | 850 |
| Ex. 60 | 81.5 | 17.5 | 1.0 | 1950 × 6 | 25 | 0.2 | 21 | 83 | 855 |
| C. Ex. 8 | 79.9 | 20 | 0.1 | 1975 × 6 | 100 | 6.5 | 30 | 64 | 600 |
| C. Ex. 9 | 92.5 | 7 | 0.5 | 1900 × 6 | 100 | 0.1 | 15 | 75 | 925 |
| C. Ex. 10 | 85.5 | 12.5 | 2 | 1900 × 6 | 50 | 0.1 | 10 | 65 | 895 |
| C. Ex. 11 | 79 | 20 | 1 | 1950 × 6 | 50 | 0.2 | 15 | 72 | 800 |

As is apparent from the results shown in Table 4, the sintered bodies according to Examples 49–60, in each of which a cooling rate after the sintering process was set to a predetermined rate, had high thermal conductivities and high strengths.

On the other hand, as in Comparative Examples 49–60, the sintered bodies, in each of which an excessively small amount or excessive amount of at least one component of $Ho_2O_3$ and $Al_2O_3$ was added, failed to achieve a sufficiently high density, a high three-point bending strength, and low thermal conductivity because the grain boundary phase was excessive or a crystal phase-to-grain boundary phase proportion was excessively low.

in Example 54, except that the oxides of rare earth elements shown in Table 5 were added instead of the $Ho_2O_3$ powder used in Example 54 to obtain the compositions as shown in Table 5.

The porosities, thermal conductivities (at 25° C.), three-point bending strengths at a room temperature and crystal phase-to-grain boundary phase proportions (by X-ray analysis) of the sintered bodies according to Examples 61–84 produced as described above were measured under the same conditions as in Example 54. The results shown in Table 5 were obtained.

TABLE 5

| Sample | Oxide of Rare Earth Element Substituted for $Ho_2O_3$ | (wt %) | Porosity (%) | Crystal Phase Ratio to Grain Boundary Phase (%) | Thermal Conductivity (W/m · K) | Three-Point Bending Strength (MPa) |
|---|---|---|---|---|---|---|
| Example 61 | $Er_2O_3$ | 8 | 0.1 | 22 | 82 | 900 |
| Example 62 | $Er_2O_3$ | 10 | 0.1 | 36 | 88 | 875 |
| Example 63 | $Er_2O_3$ | 12.5 | 0.1 | 40 | 100 | 855 |
| Example 64 | $Er_2O_3$ | 15 | 0.2 | 48 | 105 | 805 |
| Example 65 | $Yb_2O_3$ | 10 | 0.2 | 38 | 90 | 850 |
| Example 66 | $Yb_2O_3$ | 15 | 0.3 | 48 | 100 | 815 |
| Example 67 | $Dy_2O_3$ | 10 | 0.1 | 35 | 88 | 825 |
| Example 68 | $Dy_2O_3$ | 15 | 0.5 | 46 | 95 | 800 |
| Example 69 | $Pr_6O_{11}$ | 10 | 0.1 | 30 | 82 | 900 |
| Example 70 | $Pr_6O_{11}$ | 15 | 0.2 | 40 | 90 | 825 |
| Example 71 | $CeO_2$ | 10 | 0.1 | 23 | 81 | 800 |
| Example 72 | $CeO_2$ | 15 | 0.3 | 36 | 88 | 750 |
| Example 73 | $Sm_2O_3$ | 8 | 0.1 | 21 | 80 | 825 |
| Example 74 | $Sm_2O_3$ | 10 | 0.5 | 34 | 88 | 800 |
| Example 75 | $Nd_2O_3$ | 8 | 0.1 | 22 | 81 | 775 |
| Examlpe 76 | $Nd_2O_3$ | 10 | 0.2 | 32 | 87 | 750 |
| Example 77 | $Gd_2O_3$ | 10 | 0.1 | 35 | 90 | 825 |
| Example 78 | $Gd_2O_3$ | 15 | 0.3 | 40 | 96 | 800 |
| Example 79 | $Y_2O_3$ | 8 | 0.5 | 26 | 82 | 875 |
| Example 80 | $Y_2O_3$ | 10 | 0.7 | 42 | 90 | 825 |
| Example 81 | $ErO_3$ $Y_2O_3$ | 6.5 3.5 | 0.2 | 40 | 100 | 850 |
| Example 82 | $Yb_2O_3$ $Y_2O_3$ | 6.5 3.5 | 0.2 | 40 | 100 | 800 |
| Example 83 | $CeO_2$ $Y_2O_3$ | 6.5 3.5 | 0.2 | 34 | 95 | 825 |
| Example 84 | $Pr_6O_{11}$ $Y_2O_3$ | 6.5 3.5 | 0.4 | 35 | 98 | 900 |

EXAMPLES 61–84

Silicon nitride ceramic sintered bodies of Examples 61–84 were prepared under generally the same conditions as As is apparent from the results shown in Table 5, the sintered bodies according to Examples 61–84 employing other rare earth elements instead of $Ho_2O_3$ achieved generally the same properties as those of the sintered bodies employing $Ho_2O_3$.

A case wherein aluminum nitride (AlN) is used as an additive will be described below with reference to Examples described below.

EXAMPLES 85–87

12.5% by weight of $Ho_2O_3$ (holmium oxide) powder as a sintering assistant agent having an average grain size of 0.9 μm and 0.25% by weight of AlN (aluminum nitride) powder as a sintering assistant agent having an average grain size of 0.8 μm were added to a silicon nitride material powder containing 1.3% by weight of oxygen, 0.15% by weight of impurity cationic elements in terms of total amount thereof and 97% by weight of alpha-phase type silicon nitride, and having an average grain size of 0.55 μm.

The above-described mixture was wet-blended in ethyl alcohol for 72 hours by using a silicon nitride ball and then dried to obtain a material mixture powder. A predetermined amount of an organic binder was added to the material mixture powder, and then homogeneously mixed. The mixture was then press-molded under a molding pressure of 1,000 kg/cm² to obtain a plurality of molded compacts each having a size of 50 mm (length)×50 mm (width)×5 mm (thickness). After the compacts were degreased in the atmosphere gas at 700° C. for 2 hours, the compacts were sintered to enhance the density thereof, in the following manner. The degreased compacts were maintained at 1,900° C. for 6 hours in a nitrogen gas atmosphere at 9 atom to form sintered bodies. While the sintered bodies were moderately cooled, the cooling rates were measured at 100° C./hr (Example 85), 50° C./hr (Example 86) and 25° C./hr (Example 87) by controlling the power supplied to the heating devices provided in sintering furnaces until the temperature inside the furnaces reached 1,500° C. Silicon nitride ceramic sintered bodies of Examples 85–87 were thus prepared.

COMPARATIVE EXAMPLE 12

A silicon nitride sintered body of Comparative Example 12 was prepared under generally the same conditions as in Example 85, except that immediately after the sintering process is completed to enhance the density of the sintered body, the heating device was powered off to cool the sintered body at a cooling rate (about 500° C./hr) as performed by the conventional furnace cooling method.

COMPARATIVE EXAMPLE 13

A silicon nitride sintered body of Comparative Example 13 was prepared under generally the same conditions as in Example 85, except for using a silicon nitride material powder having an average grain size of 0.60 μm and containing 1.5% by weight of oxygen, 0.6% by weight of the impurity cationic elements and 93% by weight of alpha-phase type silicon nitride.

COMPARATIVE EXAMPLE 14

A silicon nitride sintered body of Comparative Example 14 was prepared under generally the same conditions as in Example 85, except for using a silicon nitride material powder having an average grain size of 1.2 μm and containing 1.7% by weight of oxygen, 0.7% by weight of the impurity cationic elements and 91% by weight of alpha-phase type silicon nitride.

The silicon nitride sintered bodies of Examples 85–87 and Comparative Examples 12–14 were examined to determine their porosities, thermal conductivities (at 25° C.), and three-bending strengths at a room temperature. Further, X-ray analysis of each sintered body was performed to determine the ratio of the crystal phase to the grain boundary phase. The results shown in Table 6 were obtained.

TABLE 6

| Sample | Cooling Rate until 1500° C. after Sintering (°C./hr) | Porosity (%) | Crystal Phase Ratio to Grain Boundary Phase (%) | Thermal Conductivity (W/m · K) | Three-Point Bending Strength (MPa) |
|---|---|---|---|---|---|
| Example 85 | 100 | 0.2 | 28 | 90 | 890 |
| Example 86 | 50 | 0.2 | 48 | 94 | 875 |
| Example 87 | 25 | 0.1 | 69 | 100 | 800 |
| Comparative Example 12 | 500 | 0.2 | 8 | 72 | 875 |
| Comparative Example 13 | 100 | 0.2 | 1 | 55 | 825 |
| Comparative Example 14 | 100 | 2.7 | 2 | 50 | 645 |

As is apparent from the results shown in Table 6, the silicon nitride sintered bodies of Examples 85–87, which were cooled at rates lower than the cooling rate in Comparative Example 12 immediately after the density-enhancing sintering process, had crystal phases formed in the grain boundary phases. A silicon nitride sintered body having a higher ratio of the crystal phase to the grain boundary phase was used to obtain a high-strength sintered body having high thermal conductivity and good heat-radiation characteristics.

On the other hand, when the cooling rate of a sintered body was set to be high to rapidly cool the sintered temperature as in Comparative Example 12, a ratio of crystal phase in the grain boundary phase was low, and the thermal conductivity was reduced to an undesired level. When a silicon nitride material powder containing a large amount of impurity cationic elements, that is, 0.6% by weight, was used as in Comparative Example 13, almost grain boundary phase was amorphous although the cooling rate was the same as in Example 85, thereby reducing the thermal conductivity.

When a coarse silicon nitride powder having an average grain size of 1.2 μm was used as in Comparative Example 14, a density was insufficiently enhanced in the sintering process. Both the strength and thermal conductivity of the sintered body of Comparative Example 14 were reduced to undesired levels.

EXAMPLES 88–102 AND COMPARATIVE EXAMPLES 15–21

Material mixtures of Examples 88–102 were prepared by varying the amounts of the same silicon nitride material powder, $Ho_2O_3$ powder, AlN powder and $Al_2O_3$ powder having an average grain size of 0.5 μm as used in Example 85 to obtain compositions shown in Table 7.

according to Examples 88–102 and Comparative Examples 15–21 produced as described above were measured under the same conditions as in Example 85. The results shown in Table 7 were obtained.

TABLE 7

| Sample | Composition (wt %) | | | | Sintering Condition Temperature × Time (°C.) × (hr) | Cooling Rate until 1500° C. after (°C./hr) | Porosity (%) | Crystal Phase Ratio to Grain Boundary Phase (%) | Thermal Conductivity (W/m · K) | Three-Point Bending Strength (MPa) |
|---|---|---|---|---|---|---|---|---|---|---|
|  | $Si_3N_4$ | $Ho_2O_3$ | AlN | $Al_2O_3$ |  |  |  |  |  |  |
| Ex. 88 | 91.9 | 8 | 0.1 |  | 1950 × 6 | 50 | 0.1 | 25 | 85 | 860 |
| Ex. 89 | 91.5 | 8 | 0.5 |  | 1900 × 6 | 25 | 0.1 | 20 | 82 | 930 |
| Ex. 90 | 89.9 | 10 | 0.1 |  | 1950 × 6 | 100 | 0.4 | 39 | 90 | 815 |
| Ex. 91 | 89.5 | 10 | 0.5 |  | 1900 × 6 | 25 | 0.1 | 22 | 85 | 860 |
| Ex. 92 | 87.4 | 12.5 | 0.1 |  | 1950 × 6 | 100 | 0.6 | 48 | 103 | 795 |
| Ex. 93 | 87.0 | 12.5 | 0.5 |  | 1900 × 6 | 50 | 0.2 | 35 | 90 | 850 |
| Ex. 94 | 86.75 | 12.5 | 0.75 |  | 1900 × 6 | 25 | 0.1 | 25 | 85 | 885 |
| Ex. 95 | 86.5 | 12.5 | 1.0 |  | 1850 × 6 | 25 | 0.1 | 20 | 80 | 890 |
| Ex. 96 | 84.75 | 15 | 0.25 |  | 1950 × 6 | 50 | 0.8 | 48 | 99 | 810 |
| Ex. 97 | 84.5 | 15 | 0.5 |  | 1900 × 6 | 50 | 0.3 | 36 | 92 | 845 |
| Ex. 98 | 84.25 | 15 | 0.75 |  | 1900 × 6 | 25 | 0.2 | 24 | 87 | 850 |
| Ex. 99 | 81.5 | 17.5 | 1.0 |  | 1950 × 6 | 25 | 0.2 | 20 | 81 | 845 |
| Ex. 100 | 87.4 | 12.5 | 0.05 | 0.05 | 1950 × 6 | 100 | 0.5 | 40 | 99 | 800 |
| Ex. 101 | 87 | 12.5 | 0.25 | 0.25 | 1900 × 6 | 50 | 0.1 | 32 | 90 | 860 |
| Ex. 102 | 86.75 | 12.5 | 0.5 | 0.25 | 1900 × 6 | 25 | 0.1 | 24 | 87 | 890 |
| C. Ex. 15 | 79.9 | 20 | 0.1 |  | 1975 × 6 | 100 | 6.2 | 30 | 66 | 625 |
| C. Ex. 16 | 92.5 | 7 | 0.5 |  | 1900 × 6 | 100 | 0.1 | 18 | 78 | 900 |
| C. Ex. 17 | 65.5 | 12.5 | 2 |  | 1900 × 6 | 50 | 0.1 | 12 | 67 | 875 |
| C. Ex. 18 | 79 | 20 | 1 |  | 1950 × 6 | 50 | 0.2 | 16 | 74 | 800 |
| C. Ex. 19 | 86 | 12.5 | 1 | 0.5 | 1900 × 6 | 50 | 0.1 | 8 | 70 | 925 |
| C. Ex. 20 | 86 | 12.5 | 0.5 | 1 | 1900 × 6 | 50 | 0.1 | 7 | 68 | 900 |
| C. Ex. 21 | 87 | 12.5 | 0.02 | 0.03 | 1900 × 6 | 100 | 2.7 | 55 | 78 | 640 |

After the material mixture were molded to form compacts and degrease the compacts under generally the same conditions as in Example 85, the degreased compacts were sintered under the conditions as shown in Table 7. The silicon nitride ceramic sintered bodies of Examples 88–102 were thus prepared.

The material mixtures of Comparative Examples 15–21 were respectively prepared as indicated in Table 7. More specifically, an excessive amount of $Ho_2O_3$ was added (Comparative Example 15), an excessively small amount of $Ho_2O_3$ was added (Comparative Example 16), an excessive amount of AlN was added (Comparative Example 17), an excessive amount of $Ho_2O_3$ was added (Comparative Example 18), an excessive total amount of AlN and $Al_2O_3$ was added (Comparative Examples 19 and 20) and an excessively small total amount of AlN and $Al_2O_3$ was added (Comparative Example 21). The material mixtures were sintered under generally the same conditions as in Example 85, thus obtaining the silicon nitride sintered bodies of

COMPARATIVE EXAMPLES 15–21.

The porosities, thermal conductivities (at 25° C.), three-point bending strengths at a room temperature and crystal phase-to-grain boundary phase proportions (by X-ray analysis) of the silicon nitride ceramic sintered bodies As is apparent from the results shown in Table 7, the sintered bodies according to Examples 88–102, which contained $Ho_2O_3$ and, if necessary, a predetermined amount of AlN and $Al_2O_3$ and in each of which a cooling rate after the sintering process was set to a predetermined rate, had high thermal conductivities and high strengths.

On the other hand, as in Comparative Examples 15–21, the sintered bodies, in each of which an excessively small total amount or excessive total amount of at least one component of $Ho_2O_3$ and $Al_2O_3$ or AlN and $Al_2O_3$ components was added, failed to achieve a sufficiently high density, a high three-point bending strength, and low thermal conductivity because the grain boundary phase was excessive or a crystal phase-to-grain boundary phase proportion was excessively low.

EXAMPLES 103–117

Silicon nitride ceramic sintered bodies of Examples 103–117 were prepared under generally the same conditions as in Example 85, except that the oxides of rare earth elements shown in Table 8 were added instead of the $Ho_2O_3$ powder used in Example 85 to obtain the compositions as shown in Table 8.

The porosities, thermal conductivities (at 25° C.), three-point bending strengths at a room temperature and crystal phase-to-grain boundary phase proportions (by X-ray analysis) of the sintered bodies according to Examples 103–117 produced as described above were measured under the same conditions as in Example 85. The results shown in Table 8 were obtained.

TABLE 8

| Sample | Oxide of Rare Earth Element Substituted for Ho$_2$O$_3$ (wt %) | Porosity (%) | Crystal Phase Ratio to Grain Boundary Phase (%) | Thermal Conductivity (W/m · K) | Three-Point Bending Strength (MPa) |
| --- | --- | --- | --- | --- | --- |
| Example 103 Er$_2$O$_3$ | 8 | 0.1 | 23 | 81 | 890 |
| Example 104 Er$_2$O$_3$ | 10 | 0.1 | 38 | 86 | 880 |
| Example 105 Er$_2$O$_3$ | 12.5 | 0.1 | 40 | 97 | 855 |
| Example 106 Er$_2$O$_3$ | 15 | 0.1 | 49 | 102 | 810 |
| Example 107 Yb$_2$O$_3$ | 10 | 0.1 | 37 | 88 | 860 |
| Example 108 Yb$_2$O$_3$ | 15 | 0.3 | 46 | 99 | 810 |
| Example 109 Dy$_2$O$_3$ | 12.5 | 0.2 | 40 | 90 | 820 |
| Example 110 Pr$_6$O$_{11}$ | 12.5 | 0.1 | 35 | 86 | 855 |
| Example 111 CeO | 12.5 | 0.2 | 34 | 85 | 770 |
| Example 112 Sm$_2$O$_3$ | 10 | 0.4 | 30 | 88 | 805 |
| Example 113 Nd$_2$O$_3$ | 10 | 0.2 | 31 | 85 | 765 |
| Example 114 Gd$_2$O$_3$ | 10 | 0.2 | 36 | 90 | 840 |
| Example 115 Y$_2$O$_3$ | 10 | 0.7 | 40 | 88 | 830 |
| Example 116 Er$_2$O$_3$ Y$_2$O$_3$ | 6.5 3.5 | 0.2 | 36 | 97 | 825 |
| Example 117 Yb$_2$O$_3$ Y$_2$O$_3$ | 6.5 3.5 | 0.2 | 38 | 98 | 825 |

As is apparent from the results shown in Table 8, the sintered bodies according to Examples 103–117 employing other rare earth elements instead of Ho$_2$O$_3$ achieved generally the same properties as those of the sintered bodies employing Ho$_2$O$_3$.

An Si$_3$N$_4$ sintered body to which an Hf compound is added will be described below with reference to Examples described below.

EXAMPLES 118–120

12.5% by weight of Ho$_2$O$_3$ (holmium oxide) powder having an average grain size of 0.9 μm and 1.5% by weight of HfO$_2$ (hafnium oxide) powder having an average grain size of 1 μm as sintering assistant agents were added to a silicon nitride material powder containing 1.3% by weight of oxygen, 0.15% by weight of impurity cationic elements in terms of total amount thereof and 97% by weight of alpha-phase type silicon nitride, and having an average grain size of 0.55 μm.

The above-described mixture was wet-blended in ethyl alcohol for 72 hours by using a silicon nitride ball and then dried to obtain a material mixture powder. A predetermined amount of an organic binder was added to the material mixture powder, and then homogeneously mixed. The mixture was then press-molded under a molding pressure of 1,000 kg/cm$^2$ to obtain a plurality of molded compacts each having a size of 50 mm (length)×50 mm (width)×5 mm (thickness). After the compacts were degreased in the atmosphere gas at 700° C. for 2 hours, the compacts were sintered to enhance the density thereof, in the following manner. The degreased compacts were maintained at 1,900° C. for 6 hours in a nitrogen gas atmosphere at 9 atom to form sintered bodies. While the sintered bodies were moderately cooled, the cooling rates were determined at 100° C./hr (Example 118), 50° C./hr (Example 119) and 25° C./hr (Example 120) by controlling the power supplied to the heating devices provided in sintering furnaces until the temperature inside the furnaces reached 1,500° C. Silicon nitride ceramic sintered bodies of Examples 118–120 were thus prepared.

COMPARATIVE EXAMPLE 22

A silicon nitride sintered body of Comparative Example 22 was prepared under generally the same conditions as in Example 118, except that immediately after the sintering process is completed to enhance the density of the sintered body, the heating device was powered off to cool the sintered body at a cooling rate (about 500° C./hr) as performed by the conventional furnace cooling method.

COMPARATIVE EXAMPLE 23

A silicon nitride sintered body of Comparative Example 23 was prepared under generally the same conditions as in Example 118, except for using a silicon nitride material powder having an average grain size of 0.60 μm and containing 1.5% by weight of oxygen, 0.6% by weight of the impurity cationic elements and 93% by weight of alpha-phase type silicon nitride.

COMPARATIVE EXAMPLE 24

A silicon nitride sintered body of Comparative Example 24 was prepared under generally the same conditions as in Example 118, except for using a silicon nitride material powder having an average grain size of 1.2 μm and containing 1.7% by weight of oxygen, 0.7% by weight of the impurity cationic elements and 91%* by weight of alpha-phase type silicon nitride.

The silicon nitride sintered bodies of Examples 118–120 and Comparative Examples 22–24 were examined to determine their porosities, thermal conductivities (at 25° C.), and three-bending strengths at a room temperature. Further, X-ray analysis of each sintered body was performed to determine the ratio of the crystal phase to the grain boundary phase. The results shown in Table 9 were obtained.

TABLE 9

| Sample | Cooling Rate until 1500° C. after Sintering (°C./hr) | Porosity (%) | Crystal Phase Ratio to Grain Boundary Phase (%) | Thermal Conductivity (W/m · K) | Three-Point Bending Strength (MPa) |
| --- | --- | --- | --- | --- | --- |
| Example 118 | 100 | 0.2 | 40 | 96 | 845 |
| Example 119 | 50 | 0.2 | 65 | 108 | 820 |
| Example 120 | 25 | 0.2 | 80 | 119 | 800 |
| Comparative Example 22 | 500 | 0.2 | 14 | 77 | 850 |
| Comparative Example 23 | 100 | 0.2 | 8 | 70 | 810 |
| Comparative Example 24 | 100 | 3.2 | 7 | 65 | 645 |

As is apparent from the results shown in Table 9, the silicon nitride sintered bodies of Examples 118–120, which were cooled at rates lower than the cooling rate in Comparative Example 22 immediately after the density-enhancing sintering process, had crystal phases formed in the grain boundary phases. A silicon nitride sintered body having a higher ratio of the crystal phase to the grain boundary phase was used to obtain a high-strength sintered body having high thermal conductivity and good heat-radiation characteristics.

On the other hand, when the cooling rate of a sintered body was set to be high to rapidly cool the sintered temperature as in Comparative Example 22, a ratio of crystal phase in the grain boundary phase was low, and the thermal conductivity was reduced to an undesired level. When a silicon nitride material powder containing a large amount of impurity cationic elements, that is, 0.6% by weight, was used as in Comparative Example 23, almost grain boundary phase was amorphous although the cooling rate was the same as in Example 118, thereby reducing the thermal conductivity.

When a coarse silicon nitride powder having an average grain size of 1.2 μm was used as in Comparative Example 24, a density was insufficiently enhanced in the sintering process. Both the strength and thermal conductivity of the sintered body of Comparative Example 24 were reduced to undesired levels.

EXAMPLES 121–177 AND COMPARATIVE EXAMPLES 25–31

Material mixtures of Examples 121–177 were prepared by varying the amounts of the same silicon nitride material powder, $Ho_2O_3$ powder and $HfO_2$ powder as used in Example 118, the amounts of rear earth element oxide powder various metal compound powders shown in Tables 10–12 and the amounts of $Al_2O_3$ powder and AlN powder to obtain compositions shown in Tables 10–12.

After the material mixture were molded to form compacts and degrease the compacts under generally the same conditions as in Example 118, the degreased compacts were sintered under the conditions as shown in Tables 10–12. The silicon nitride ceramic sintered bodies of Examples 121–177 were thus prepared.

The material mixtures of Comparative Examples 25–31 were respectively prepared as indicated in Table 12. More specifically, an excessively small amount of $HfO_2$ was added (Comparative Example 25), an excessively small amount of $Ho_2O_3$ was added (Comparative Example 26), an excessive amount of $HfO_2$ was added (Comparative Example 27), an excessive amount of $Ho_2O_3$ (Comparative Example 28), an excessive amount of $TiO_2$ was added (Comparative Example 29), an excessive amount of AlN was added (Comparative Example 30) and an excessively small amount of alumina was added (Comparative Example 31). The material mixtures were sintered under generally the same conditions as in Example 118, thus obtaining the silicon nitride sintered bodies of

COMPARATIVE EXAMPLES 25–31.

The porosities, thermal conductivities (at 25° C.), three-point bending strengths at a room temperature and crystal phase-to-grain boundary phase proportions (by X-ray analysis) of the silicon nitride ceramic sintered bodies according to Examples 121–177 and Comparative Examples 25–31 produced as described above were measured under the same conditions as in Example 118. The results shown in Tables 10–12 were obtained.

TABLE 10

| Sample No. | Composition (wt %) | | | | | Sintering Condition Temperature × Time (°C.) × (hr) | Cooling Rate until 1500° C. after Sintering (°C./hr) | Porosity (%) | Crystal Phase Ratio to Grain Boundary Phase (%) | Thermal Conductivity (W/m · k) | Three-Point Bending Strength (MPa) |
| | $Si_3N_4$ | Oxide of Rare Earth Element | Other Component | $Al_2O_3$ | AlN | | | | | | |
| --- | --- | --- | --- | --- | --- | --- | --- | --- | --- | --- | --- |
| Example 121 | 91.9 | $Ho_2O_3$ 8 | $HfO_2$ 0.1 | | | 1900 × 6 | 50 | 0.3 | 39 | 98 | 810 |
| Example 122 | 91.5 | $Ho_2O_3$ 8 | $HfO_2$ 0.5 | | | 1900 × 6 | 50 | 0.1 | 44 | 102 | 800 |
| Example 123 | 90 | $Ho_2O_3$ 8 | $HfO_2$ 2 | | | 1850 × 6 | 50 | 0.1 | 49 | 100 | 895 |
| Example 124 | 89.5 | $Ho_2O_3$ 10 | $HfO_2$ 0.5 | | | 1900 × 6 | 50 | 0.1 | 46 | 110 | 805 |
| Example 125 | 89 | $Ho_2O_3$ 10 | $HfO_2$ 1 | | | 1900 × 6 | 50 | 0.1 | 50 | 114 | 780 |
| Example 126 | 88 | $Ho_2O_3$ 10 | $HfO_2$ 2 | | | 1850 × 6 | 25 | 0.1 | 52 | 110 | 840 |
| Example 127 | 87 | $Ho_2O_3$ 12.5 | $HfO_2$ 0.5 | | | 1900 × 6 | 50 | 0.1 | 60 | 112 | 825 |
| Example 128 | 85.5 | $Ho_2O_3$ 12.5 | $HfO_2$ 2 | | | 1850 × 6 | 25 | 0.1 | 69 | 116 | 800 |
| Example 129 | 84.5 | $Ho_2O_3$ 12.5 | $HfO_2$ 3 | | | 1850 × 6 | 100 | 0.1 | 50 | 103 | 780 |

TABLE 10-continued

| Sample No. | Composition (wt %) Si₃N₄ | Oxide of Rare Earth Element | | Other Component | | Al₂O₃ | AlN | Sintering Condition Temperature × Time (°C.) × (hr) | Cooling Rate until 1500° C. after Sintering (°C./hr) | Porosity (%) | Crystal Phase Ratio to Grain Boundary Phase (%) | Thermal Conductivity (W/m · k) | Three-Point Bending Strength (MPa) |
|---|---|---|---|---|---|---|---|---|---|---|---|---|---|
| Example 130 | 84 | Ho₂O₃ | 15 | HfO₂ | 1 | | | 1900 × 6 | 50 | 0.1 | 72 | 120 | 800 |
| Example 131 | 83 | Ho₂O₃ | 15 | HfO₂ | 2 | | | 1900 × 6 | 50 | 0.1 | 79 | 132 | 820 |
| Example 132 | 81.5 | Ho₂O₃ | 17.5 | HfO₂ | 1 | | | 1900 × 6 | 50 | 0.2 | 42 | 109 | 775 |
| Example 133 | 80.5 | Ho₂O₃ | 17.5 | HfO₂ | 2 | | | 1900 × 6 | 50 | 0.1 | 65 | 116 | 760 |
| Example 134 | 83 | Ho₂O₃ | 15 | HfC | 2 | | | 1900 × 6 | 25 | 0.1 | 70 | 126 | 790 |
| Example 135 | 84 | Ho₂O₃ | 15 | HfN | 1 | | | 1900 × 6 | 50 | 0.2 | 61 | 120 | 745 |
| Example 136 | 84.5 | Ho₂O₃ | 15 | TiO₂ | 0.5 | | | 1900 × 6 | 25 | 0.1 | 52 | 109 | 715 |
| Example 137 | 84.5 | Ho₂O₃ | 15 | ZrO₂ | 0.5 | | | 1900 × 6 | 25 | 0.1 | 36 | 95 | 730 |
| Example 138 | 84 | Ho₂O₃ | 15 | WO₃ | 1 | | | 1900 × 6 | 25 | 0.3 | 30 | 90 | 700 |
| Example 139 | 84 | Ho₂O₃ | 15 | Nb₂O₅ | 1 | | | 1900 × 6 | 25 | 0.1 | 38 | 99 | 725 |
| Example 140 | 84 | Ho₂O₃ | 15 | Ta₂O₅ | 1 | | | 1900 × 6 | 25 | 0.1 | 40 | 112 | 735 |
| Example 141 | 84 | Ho₂O₃ | 15 | Cr₂O₃ | 1 | | | 1900 × 6 | 25 | 0.1 | 49 | 116 | 700 |
| Example 142 | 84.5 | Ho₂O₃ | 15 | TiC | 0.5 | | | 1900 × 6 | 100 | 0.2 | 38 | 95 | 725 |

TABLE 11

| Sample No. | Composition (wt %) Si₃N₄ | Oxide of Rare Earth Element | | Other Component | | Al₂O₃ | AlN | Sintering Condition Temperature × Time (°C.) × (hr) | Cooling Rate until 1500° C. after Sintering (°C./hr) | Porosity (%) | Crystal Phase Ratio to Grain Boundary Phase (%) | Thermal Conductivity (W/m · k) | Three-Point Bending Strength (MPa) |
|---|---|---|---|---|---|---|---|---|---|---|---|---|---|
| Example 143 | 84.5 | Ho₂O₃ | 15 | TiN | 0.5 | | | 1900 × 6 | 50 | 0.2 | 45 | 110 | 690 |
| Example 144 | 84 | Ho₂O₃ | 15 | TiB₂ | 1 | | | 1900 × 6 | 25 | 0.1 | 30 | 90 | 705 |
| Example 145 | 85.5 | Er₂O₃ | 12.5 | HfO₂ | 2 | | | 1900 × 6 | 50 | 0.1 | 69 | 128 | 760 |
| Example 146 | 83 | Er₂O₃ | 15 | HfO₂ | 2 | | | 1900 × 6 | 50 | 0.1 | 60 | 120 | 785 |
| Example 147 | 89 | Yb₂O₃ | 10 | HfO₂ | 1 | | | 1900 × 6 | 50 | 0.1 | 40 | 99 | 680 |
| Example 148 | 83 | Yb₂O₃ | 15 | HfO₂ | 2 | | | 1900 × 6 | 50 | 0.1 | 60 | 125 | 675 |
| Example 149 | 83 | Dy₂O₃ | 15 | HfO₂ | 2 | | | 1900 × 6 | 50 | 0.2 | 46 | 110 | 750 |
| Example 150 | 85.5 | Pr₆O₁₁ | 12.5 | HfO₂ | 2 | | | 1900 × 6 | 50 | 0.1 | 43 | 102 | 845 |
| Example 151 | 83 | CeO₃ | 15 | HfO₂ | 2 | | | 1900 × 6 | 50 | 0.1 | 39 | 99 | 750 |
| Example 152 | 85.5 | Sm₂O₃ | 12.5 | HfO₂ | 2 | | | 1900 × 6 | 50 | 0.1 | 43 | 106 | 770 |
| Example 153 | 83 | Nd₂O₃ | 15 | HfO₂ | 2 | | | 1900 × 6 | 50 | 0.1 | 45 | 109 | 695 |
| Example 154 | 88 | Gd₂O₃ | 10 | HfO₂ | 2 | | | 1900 × 6 | 50 | 0.2 | 39 | 97 | 700 |
| Example 155 | 90 | Y₂O₃ | 8 | HfO₂ | 2 | | | 1900 × 6 | 50 | 0.2 | 42 | 102 | 800 |
| Example 156 | 84.5 | Er₂O₃ | 15 | TiO₂ | 0.5 | | | 1900 × 6 | 50 | 0.1 | 44 | 110 | 725 |
| Example 157 | 87 | Yb₂O₃ | 12.5 | TiO₂ | 0.5 | | | 1900 × 6 | 50 | 0.2 | 62 | 123 | 680 |
| Example 158 | 84.5 | Er₂O₃ | 15 | WO₃ | 0.5 | | | 1900 × 6 | 50 | 0.3 | 37 | 96 | 720 |
| Example 159 | 82.8 | Ho₂O₃ | 15 | HfO₂ TiO₂ | 2 0.2 | | | 1900 × 6 | 50 | 0.1 | 59 | 118 | 700 |
| Example 160 | 85.3 | Er₂O₃ | 12.5 | HfO₂ TiO₂ | 2 0.2 | | | 1900 × 6 | 50 | 0.1 | 58 | 119 | 775 |
| Example 161 | 85.3 | Yb₂O₃ | 12.5 | HfO₂ TiO₂ | 2 0.2 | | | 1900 × 6 | 50 | 0.1 | 58 | 120 | 725 |
| Example 162 | 89.8 | Y₂O₃ | 8 | HfO₂ TiO₂ | 2 0.2 | | | 1900 × 6 | 50 | 0.2 | 40 | 100 | 760 |

TABLE 12

| Sample No. | Composition (wt %) Si₃N₄ | Oxide of Rare Earth Element | | Other Component | | Al₂O₃ | AlN | Sintering Condition Temperature × Time (°C.) × (hr) | Cooling Rate until 1500° C. after Sintering (°C./hr) | Porosity (%) | Crystal Phase Ratio to Grain Boundary Phase (%) | Thermal Conductivity (W/m · k) | Three-Point Bending Strength (MPa) |
|---|---|---|---|---|---|---|---|---|---|---|---|---|---|
| Example 163 | 88 | Ho₂O₃ Y₂O₃ | 6.5 3.5 | HfO₂ | 2 | | | 1900 × 6 | 50 | 0.2 | 55 | 120 | 720 |
| Example 164 | 88 | Er₂O₃ Y₂O₃ | 6.5 3.5 | HfO₂ | 2 | | | 1900 × 6 | 50 | 0.1 | 54 | 119 | 775 |

TABLE 12-continued

| Sample No. | Composition (wt %) | | | | | Sintering Condition Temperature × Time (°C.) × (hr) | Cooling Rate until 1500° C. after Sintering (°C./hr) | Porosity (%) | Crystal Phase Ratio to Grain Boundary Phase (%) | Thermal Conductivity (W/m · k) | Three-Point Bending Strength (MPa) |
|---|---|---|---|---|---|---|---|---|---|---|---|
| | $Si_3N_4$ | Oxide of Rare Earth Element | Other Component | $Al_2O_3$ | AlN | | | | | | |
| Example 165 | 88 | $Yb_2O_3$ 6.5 $Y_2O_3$ 3.5 | $HfO_2$ | 2 | | 1900 × 6 | 50 | 0.2 | 60 | 125 | 750 |
| Example 166 | 83.9 | $Ho_2O_3$ 15 | $HfO_2$ | 1 | 0.1 | 1900 × 6 | 50 | 0.1 | 49 | 106 | 770 |
| Example 167 | 84 | $Ho_2O_3$ 15 | $HfO_2$ | 0.5 | 0.5 | 1900 × 6 | 50 | 0.1 | 30 | 90 | 850 |
| Example 168 | 82 | $Ho_2O_3$ 15 | $HfO_2$ | 2 | 1 | 1850 × 6 | 25 | 0.1 | 22 | 82 | 900 |
| Example 169 | 82.5 | $Ho_2O_3$ 15 | $HfO_2$ | 2 | 0.5 | 1900 × 6 | 50 | 0.1 | 39 | 100 | 880 |
| Example 170 | 83 | $Ho_2O_3$ 15 | $HfO_2$ | 2 | 1 | 1900 × 6 | 50 | 0.1 | 24 | 88 | 870 |
| Example 171 | 82.6 | $Ho_2O_3$ 15 | $HfO_2$ | 2 | 0.2 0.2 | 1900 × 6 | 50 | 0.1 | 37 | 100 | 885 |
| Example 172 | 82.5 | $Er_2O_3$ 15 | $HfO_2$ | 0.5 | | 1900 × 6 | 50 | 0.1 | 40 | 94 | 850 |
| Example 173 | 82.5 | $Er_2O_3$ 15 | $HfO_2$ | 2 | 0.5 | 1900 × 6 | 50 | 0.1 | 38 | 93 | 825 |
| Example 174 | 89.8 | $Y_2O_3$ 8 | $HfO_2$ | 2 | 0.2 | 1900 × 6 | 50 | 0.1 | 36 | 95 | 800 |
| Example 175 | 84 | $Ho_2O_3$ 15 | $TiO_2$ | 0.5 | 0.5 | 1900 × 6 | 50 | 0.1 | 28 | 88 | 820 |
| Example 176 | 84 | $Er_2O_3$ 15 | $TiO_2$ | 0.5 | 0.5 | 1900 × 6 | 50 | 0.1 | 27 | 88 | 810 |
| Example 177 | 84 | $Yb_2O_3$ 12.5 | $TiO_2$ | 0.5 | 0.5 | 1900 × 6 | 50 | 0.1 | 27 | 90 | 700 |
| Comparative Example 25 | 82.45 | $Ho_2O_3$ 17.5 | $HfO_2$ | 0.05 | | 1900 × 6 | 50 | 3.6 | 27 | 70 | 640 |
| Comparative Example 26 | 94 | $Ho_2O_3$ 5 | $HfO_2$ | 1 | | 1900 × 6 | 50 | 0.1 | 15 | 75 | 730 |
| Comparative Example 27 | 83.5 | $Ho_2O_3$ 12.5 | $HfO_2$ | 4 | | 1900 × 6 | 50 | 0.1 | 35 | 79 | 630 |
| Comparative Example 28 | 79 | $Ho_2O_3$ 20 | $HfO_2$ | 1 | | 1900 × 6 | 50 | 2.8 | 40 | 78 | 645 |
| Comparative Example 29 | 83.5 | $Ho_2O_3$ 12.5 | $TiO_2$ | 4 | | 1900 × 6 | 50 | 0.1 | 14 | 70 | 675 |
| Comparative Example 30 | 83.5 | $Ho_2O_3$ 12.5 | $HfO_2$ | 2 | 2 | 1900 × 6 | 50 | 0.1 | 8 | 64 | 900 |
| Comparative Example 31 | 85 | $Ho_2O_3$ 12.5 | $TiO_2$ | 0.5 | 2 | 1900 × 6 | 100 | 0.1 | 5 | 59 | 920 |

As is apparent from the results shown in Tables 10–12, the sintered bodies according to Examples 121–177, which contained $Ho_2O_3$, rare earth element compounds and various metal compounds such as $HfO_2$ and, if necessary, a predetermined amount of $Al_2O_3$ and AlN, and in each of which a cooling rate after the sintering process was set to a predetermined rate, had high thermal conductivities and high strengths.

On the other hand, as in Comparative Examples 25–31, the sintered bodies, in each of which an excessively small amount or excessive amount of at least one component of $Ho_2O_3$, $HfO_2$, $TiO_2$, $Al_2O_3$ and AlN was added, failed to achieve a sufficiently high density, a high three-point bending strength, and low thermal conductivity because the grain boundary phase was excessive or a crystal phase-to-grain boundary phase proportion was excessively low.

In addition to Examples described above, material mixtures were prepared by adding 12.5% by weight of $Ho_2O_3$ powder, 1% by weight of one compound selected from the group consisting of ZrC, VC, NbC, TaC, $Cr_3C_2$, $Mo_2C$, TiN, ZrN, VN, TaN, CrN, $Mo_2N$, $W_2N$, $HfSi_2$, $TiSi_2$, $ZrSi_2$, $VSi_2$, $NbSi_2$, $TaSi_2$, $CrSi_2$, $MoSi_2$, $WSi_2$, $ZrB_2$, $VB_2$, $NbB_2$, $TaB_2$, $CrB_2$, $MoB_2$ and $WB_2$ to silicon nitride powder were sintered under the same conditions as in Example 118 to produce various $Si_3N_4$ sintered bodies.

The porosities, thermal conductivities (at 25° C.), three-point bending strengths at a room temperature and crystal phase-to-grain boundary phase proportions (by X-ray analysis) of the $Si_3N_4$ sintered bodies were measured under the same conditions as in Example 118. In this case, the same results as obtained in Examples 118–177 could be obtained.

The embodiment of a press-contacted body according to the present invention will be described below with reference to Examples described below.

A heat-radiating plate consisting of a high thermal conductive silicon nitride sintered body will be described first, and a thyristor serving as a press-contacted body using this heat-radiating plate will be described next.

EXAMPLES 178 and 179

5% by weight of $Y_2O_3$ (yttrium oxide) powder having an average grain size of 0.7 µm and 1.5% by weight of $Al_2O_3$ (alumina) powder having an average grain size of 0.5 µm as sintering assistant agents were added to a silicon nitride material powder containing 1.3% by weight of oxygen, 0.15% by weight of Li, Na, K, Fe, Ca, Mg, Sr, Ba, Mn and B as impurity cationic elements in terms of total amount thereof and 97% by weight of alpha-phase type silicon nitride, and having an average grain size of 0.55 µm.

The above-described mixture was wet-blended in ethyl alcohol for 24 hours and then dried to obtain a material mixture powder. A predetermined amount of an organic binder was added to the material mixture powder, and then homogeneously mixed. The mixture was then press-molded under a molding pressure of 1,000 kg/cm² to obtain a plurality of molded compacts each having a disk-like shape.

After the compacts were degreased in the atmosphere gas at 700° C. for 2 hours, the compacts were sintered to enhance the density thereof, in the following manner. The degreased compacts were maintained at 1,900° C. for 6 hours in a nitrogen gas atmosphere at 9 atom to form sintered bodies. While the sintered bodies were cooled, the cooling rates were determined at 50° C./hr (Example 178) and 25° C./hr (Example 179) by controlling the power supplied to the heating devices provided in sintering furnaces until the temperature inside the furnaces reached 1,500° C. Each of the resultant sintered bodies was polished to set their surface roughness at 5 μm-Rmax and to have a size of 0.3 mm (thickness)×70 mm (diameter), thereby producing press-contacting silicon nitride heat-radiating plates of Examples 178–179.

COMPARATIVE EXAMPLE 32

A press-contacting silicon nitride sintered heat-radiating plate of Comparative Example 32 was prepared under generally the same conditions as in Example 178, except that immediately after the sintering process is completed to enhance the density of the sintered body, the heating device was powered off to cool the sintered body at a cooling rate (about 500° C./hr) as performed by the conventional furnace cooling method.

COMPARATIVE EXAMPLE 33

A press-contacting silicon nitride heat-radiating plate of Comparative Example 33 was prepared under generally the same conditions as in Example 178, except for using a silicon nitride material powder having an average grain size of 0.60 μm and containing 1.5% by weight of oxygen, 0.6% by weight of the impurity cationic elements in terms of a total amount and 93% by weight of alpha-phase type silicon nitride, and setting the cooling rate to 100° C./hr.

COMPARATIVE EXAMPLE 34

A press-contacting silicon nitride heat-radiating plate of Comparative Example 34 was prepared under generally the same conditions as in Example 178, except for using a silicon nitride material powder having an average grain size of 1.1 μm and containing 1.7% by weight of oxygen, 0.7% by weight of the impurity cationic elements and 91% by weight of alpha-phase type silicon nitride, and setting the cooling rate to 100° C./hr.

The porosities and thermal conductivities at 25° C. of the press-contacting silicon nitride heat-radiating plates of Examples 178 and 179 and Comparative Examples 32–34 obtained as described above were measured. The crystal phase-to-grain boundary phase proportions (by X-ray analysis) of the $Si_3N_4$ heat-radiating plates were measured and the result shown in Table 13 were obtained.

On the other hand, when the cooling rate of a sintered body was set to be high to rapidly cool the sintered temperature as in Comparative Example 32, the grain boundary phase was entirely amorphous, and the thermal conductivity was reduced to an undesired level. When a silicon nitride material powder containing a large amount of impurity cationic elements, that is, 0.6% by weight, was used as in Comparative Example 33, the grain boundary phase was entirely amorphous although the cooling rate was set to a relatively low level, thereby reducing the thermal conductivity.

When a coarse silicon nitride powder having an average grain size of 1.1 μm was used as in Comparative Example 34, a density was insufficiently enhanced in the sintering process. Both the strength and thermal conductivity of the press-contacting silicon nitride heat-radiating plate of Comparative Example 34 were reduced to undesired levels.

COMPARATIVE EXAMPLE 35

On the other hand, an AlN heat-radiating plate according to Comparative Example 35 having the same size as that in Examples was produced by using an aluminum nitride (AlN) sintered body having a thickness of 0.3 mm and a thermal conductivity of 170 W/m·K instead of the $Si_3N_4$ sintered body in Examples.

COMPARATIVE EXAMPLE 36

An AlN heat-radiating plate according to Comparative Example 36 having the same size as that in Examples was produced by using an aluminum nitride (AlN) sintered body having a thickness of 0.8 mm and a thermal conductivity of 70 W/m·K instead of the $Si_3N_4$ sintered body of Examples.

COMPARATIVE EXAMPLE 37

An $Al_2O_3$ heat-radiating plate according to Comparative Example 37 having the same size as that in Examples was produced by using an aluminum oxide ($Al_2O_3$) sintered body having a thickness of 0.3 mm and a thermal conductivity of 20 W/m·K instead of the $Si_3N_4$ sintered body of Examples.

To evaluate the strength characteristics and dielectric breakdown characteristics of the heat-radiating plates of

TABLE 13

| $Si_3N_4$ Heat-Radiating Plate Sample No. | Cooling Rate until 1500° C. after Sintering (°C./hr) | Porosity (%) | Crystal Phase Ratio to Grain Boundary Phase (%) | Thermal Conductivity (W/m · K) |
|---|---|---|---|---|
| Example 178 | 50 | 0.2 | 50 | 92 |
| Example 179 | 25 | 0.2 | 80 | 115 |
| Comparative Example 32 | 500 | 0.2 | 0 | 40 |
| Comparative Example 33 | 100 | 0.3 | 0 | 27 |
| Comparative Example 34 | 100 | 2.5 | 0 | 20 |

As is apparent from the results shown in Table 13, the silicon nitride sintered bodies of Examples 178–179, which were cooled at rates lower than the cooling rate in Comparative Example 32 immediately after the density-enhancing sintering process, had crystal phases formed in the grain boundary phases. A silicon nitride sintered body having a higher ratio of the crystal phase to the grain boundary phase was used to obtain a press-contacting $Si_3N_4$ heat-radiating plate having high thermal conductivity and good heat-radiation characteristics.

Examples and Comparative Examples prepared as described above, the three-point bending strengths of the heat-radiating plates were measured, and a dielectric breakdown test was performed to measure the dielectric strengths of the heat-radiating plates.

The dielectric breakdown test was performed in the following manner. More specifically, a voltage of 50 Hz was applied to electrodes provided on both the surfaces of each heat-radiating plate dipped in insulating oil to measure a minimum voltage obtained when dielectric breakdown occurred in the heat-radiating plate. The breakdown strength is expressed by a value obtained by dividing the measured minimum dielectric breakdown voltage by the thickness of the heat-radiating plate.

Figure 3:
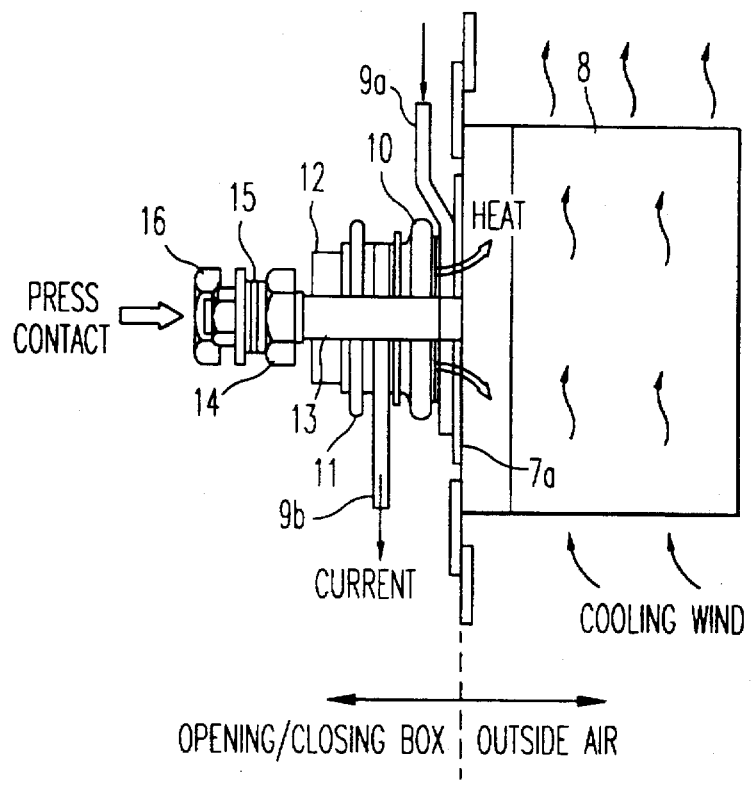
FIG. 3 is a side view showing another structure of a vehicle-mounting type thyristor.

A large number of vehicle-mounting type thyristors shown in FIG. 3 were prepared using the heat-radiating plates according to Examples and Comparative Examples described above. Each thyristor is constituted in the following manner. More specifically, a press-contacting heat-radiating plate 7a, a terminal 9a, a rectifier 10, a terminal 9b, an insulating spacer 11 and a press-contact plate 12 are stacked on a side surface of a cooling fin 8; a press plate 14 is attached to a bolt extending from the cooling fin 8; a press-contact screw 16 is attached to the bolt 13 through a disk spring ; and the press-contact screw 16 is fastened to press-contact the rectifier 10 to the heat-radiating plate 7a a side.

When the large number of thyristors were produced using the various types of heat-radiating plates as described above, a ratio of heat-radiating plates which were cracked or damaged by press-contact force of the press-contact screw 16 in the assembly process to all the heat-radiating plates was measured to calculate the production yield of the thyristors.

The measurement results are shown in Table 14.

parative Examples 36 and 37, and therefore exhibit good dielectric breakdown characteristics.

When the heat-radiating plate according to Example having a three-point ending strength and a breakdown strength which are twice or more than those of a conventional heat-radiating plate is used, even if the required mechanical strength and the breakdown strength are set to be equal to conventional ones, the thickness of the heat-radiating plate can be reduced to ½ or less the thickness of the conventional heat-radiating plate. In this case, the heat resistance value of the heat-radiating plate can be reduced because the thickness of the heat-radiating plate can be reduced to ½ that of the conventional heat-radiating plate, and the heat-radiating characteristics can be synergistically improved. Heat-generating parts can also be packaged at a high density by reducing the thickness of the heat-radiating plate, and a reduction in size of a press-contacted body part such as a thyristor can be performed.

On the other hand, although the press-contact type $Si_3N_4$ sintered bodies according to Comparative Examples 32–34 achieved good three-point bending strengths, the thermal conductivities of the press-contact type $Si_3N_4$ sintered bodies were relatively low, that is, 40 W/m·K or less. Therefore, it was found that the sintered bodies were not suitable for press-contacted body parts which pointed to high output power.

TABLE 14

| Sample No. | Type | Heat-Radiating Plate ||||Production Yeild of Thyristor (%) |
| | | Thickness (mm) | Thermal Conductivity (W/m·K) | Three-Point Bending Strength (MPa) | Dielectric Strength (KV/mm) | |
| --- | --- | --- | --- | --- | --- | --- |
| Example 178 | $Si_3N_4$ | 0.3 | 92 | 700 | 35 | 100 |
| Example 179 | $Si_3N_4$ | 0.3 | 115 | 640 | 33 | 100 |
| Comparative Example 32 | $Si_3N_4$ | 0.3 | 40 | 690 | 31 | 100 |
| Comparative Example 33 | $Si_3N_4$ | 0.3 | 27 | 680 | 32 | 100 |
| Comparative Example 34 | $Si_3N_4$ | 0.3 | 20 | 640 | 34 | 100 |
| Comparative Example 35 | AlN | 0.3 | 170 | 275 | 15 | 92 |
| Comparative Example 36 | AlN | 0.3 | 70 | 314 | 15 | 95 |
| Comparative Example 37 | $Al_2O_3$ | 0.3 | 20 | 245 | 18 | 89 |

As is apparent from the results shown in Table 14, according to the press-contacted $Si_3N_4$ heat-radiating plates of Examples, the three-point bending strengths tend to be larger than those of Comparative Examples. Therefore, the following was proved. More specifically, fastening cracks were rarely formed in the assembly step for the thyristor, and the production yield of press-contacted bodies using press-contacting heat-radiating plates could be considerably improved.

Further, since the $Si_3N_4$ heat-radiating plates of Examples have thermal conductivities which are about twice to five times those of the heat-radiating plates of Comparative Examples 32–34 each consisting of a conventional $Si_3N_4$ sintered body, the $Si_3N_4$ heat radiating plates of Examples achieve good heat-radiating characteristics, and are very effective as heat-radiating plates which cope with high output power and high heat generation.

The breakdown strengths of the heat-radiating plates of Examples are about twice the breakdown strength of the conventional AlN or $Al_2O_3$ sintered bodies shown in Com- The AlN sintered body having a high thermal conductivity is used in the AlN heat-radiating plate according to Comparative Example 35. For this reason, the AlN sintered body has good heat-radiating characteristics, but poor strength and a small amount of flexibility. It was confirmed that the AlN sintered body could not withstand fastening cracks in the assembly step and impact in handling. Further, it was found that the AlN sintered body had poor withstand voltage characteristics.

The AlN circuit board according to Comparative Example 36 has good heat-radiating characteristics because the AlN circuit board has a heat conductivity higher than that of a conventional $Si_3N_4$ substrate, and achieves insufficient strength. It was found that the withstand voltage characteristics of the AlN circuit board reduced.

On the other hand, a conventional $Al_2O_3$ heat-radiating plate according to Comparative Example 37 has low thermal conductivity, low three-point bending strength and low breakdown strength. For this reason, the $Al_2O_3$ heat-radiating plate achieves poor heat-radiating characteristics and poor durability, a large number of cracks damages are formed in the heat-radiating plate in the assembly process. Therefore, the production yield of thyristors considerably reduced.

The embodiment of thyristors serving as press-contacted body parts using other silicon nitride sintered bodies (heat-radiating plates) having various compositions and characteristic values will be described below with reference to Example 180 described below.

EXAMPLE 180

The high thermal conductive silicon nitride sintered bodies of Examples 4–17 shown in Table 2 and the high thermal conductive silicon nitride sintered bodies of Examples 121–162 shown in Tables 10 and 11 were selected as heat-radiating plate materials.

The surfaces of the selected silicon nitride sintered body were polished to adjust their surface roughnesses to 5 μm-Rmax, and then polished to each have a size of 0.3 mm (thickness)×70 mm (diameter), thereby obtaining silicon nitride heat-radiating plates for thyristors. In addition, a large number of thyristors serving as vehicle-mounting type press-contacted bodies according to Example 180 as shown in FIG. 3 were prepared by using the silicon nitride heat-radiating plates described above. As in Examples 178 and 179, the ratio of heat-radiating plates which were cracked or damaged by press-contact force of the press-contact screw 16 in the assembly process to all the heat-radiating plates was measured. No fastening cracks were not detected in the heat-radiating plates. It was found that the production yield of products using the press-contacting heat-radiating plates could be considerably improved.

Further, since each $Si_3N_4$ heat-radiating plate according to Example 180 has a thermal conductivity about twice to five times that of a heat-radiating plate consisting of a conventional $Si_3N_4$ sintered body, the $Si_3N_4$ heat-radiating plate achieves good heat-radiating characteristics, and is very effective as a heat-radiating plate which copes with high output power and high heat generation.

INDUSTRIAL APPLICABILITY

As has been described above, according to a high thermal conductive silicon nitride sintered body and a method of manufacturing the same of the present invention, a silicon nitride sintered body having high strength and a high thermal conductivity can be obtained. Therefore, The silicon nitride sintered body is very effective as a substrate such as a semiconductor substrate or a substrate for a heat-radiating plate.

In particular, when a heat-generating part is press-contacted to a heat-radiating plate consisting of the high thermal conductive silicon nitride sintered body to form a press-contacted body such as a thyristor, no fastening cracks are formed in the heat-radiating plate the assembly process, and the press-contacted body can be mass-produced at a high production yield.

Since the silicon nitride sintered body has a high toughness, cracks are rarely formed in the heat-radiating plate by a heat cycle from the heat-generating part, and heat-cycle characteristics are considerably improved. Therefore, there can be provided a press-contacted body having high durability and high reliability.

In particular, the silicon nitride sintered body itself has high mechanical strength, when required mechanical strength characteristics are kept constant, the heat-radiating plate consisting of the silicon nitride sintered body can have a thickness smaller than that of a heat-radiating plate consisting of another ceramic sintered body. Because the thickness of the heat-radiating plate can be reduced, the heat resistance value can be further reduced, and the heat-radiation characteristics can be more improved. Since a heat-radiating plate which is thinner than a conventional heat-radiating plate can achieve required mechanical characteristics, heat-generating parts can be packaged or mounted at a high density, thereby reducing a press-contacted body in size.

We claim:

1. A high thermal conductive silicon nitride sintered body which comprises more than more than 7.5% to at most 17.5% by weight of a rare earth element in terms of the amount of an oxide thereof; and at most 0.3% by weight of Li, Na, K, Fe, Ca, Mg, Sr, Ba, Mn and B as impurity cationic elements in terms of a total amount thereof, and having a thermal conductivity of at least 80 W/m·K.

2. A high thermal conductive silicon nitride sintered body having a thermal conductivity of at least 80 W/Mk, which comprises more than 7.5% to at most 17.5% by weight of a rare earth element in terms of the amount of an oxide thereof; and at most 0.3% by weight of Li, Na, K, Fe, Ca, Mg, Sr, Ba, Mn and B as impurity cationic elements in terms of total amount thereof, comprising a silicon nitride crystal and a grain boundary phase, and having the ratio of a crystal compound phase formed on said grain boundary phase to said entire grain boundary phase of at least 20%.

3. A high thermal conductive silicon nitride sintered body which comprises more than 7.5% to at most 17.5% by weight of a rare earth element in terms of the amount of an oxide thereof, comprising a silicon nitride crystal and a grain boundary phase, and having the ratio of a crystal compound phase formed in said grain boundary phase to said entire grain boundary phase of at least 20% and a thermal conductivity of at least 80 W/m·K.

4. The high thermal conductive silicon nitride sintered body according to claim 1, wherein the rare earth element is a lanthanoid.

5. The high thermal conductive silicon nitride sintered body according to claim 1, which comprises at most 1.0% by weight of aluminum in terms of amount of alumina.

6. The high thermal conductive silicon nitride sintered body according to claim 1, which comprises at most 1.0% by weight of aluminum nitride.

7. The high thermal conductive silicon nitride sintered body according to claim 1, which comprises 0.1–3.0% by weight of at least one element selected from the group consisting of Ti, Zr, Hf, V, Nb, Ta, Cr, Mo and W in terms of the amount of an oxide thereof.

8. The high thermal conductive silicon nitride sintered body according to claim 1, which has a porosity of at most 2.5% by volume, a thermal conductivity of at least 80 W/m·K, and a three-point bending strength of at least 650 MPa at a room temperature.

9. A method of producing a high thermal conductive silicon nitride sintered body having a thermal conductivity of at least 80 W/mk, which comprises forming a compact by molding a mixture obtained by adding more than 7.5% to at most 17.5% by weight of a rare earth element in terms of the amount of an oxide thereof, to a silicon nitride powder which contains at most 1.7% by weight of oxygen, at most 0.3% by weight of Li, Na, K, Fe, Ca, Mg, Sr, Ba, Mn and B as impurity cationic elements in terms of total amount thereof, and at least 90% by weight of alpha-phase silicon nitride, and which has an average grain size of at most 1.0

μm; degreasing the compact; sintering the compact at a temperature of 1,800°–2,100° C. while pressurizing the atmosphere around the compact to form a sintered body; and moderately cooling the sintered body at a cooling rate of at most 100° C. per hour until the temperature is reduced to a point at which a liquid phase formed of the rare earth element during the sintering step solidifies.

10. The method of producing high thermal conductive silicon nitride sintered body according to claim 9, wherein at most 1.0% by weight of at least one of alumina and aluminum nitride is added to a silicon nitride powder.

11. The method of producing high thermal conductive silicon nitride sintered body according to claim 9, wherein 0.1–3.0% by weight of at least one element selected from the group consisting of Ti, Zr, Hf, V, Nb, Ta, Cr, Mo and W in terms of the amount of an oxide thereof is added to a silicon nitride powder.

12. A press-contacted body, which comprises the heat-generating part which is press-contacted to a heat-radiating plate consisting essentially of a high thermal conductive silicon nitride sintered body containing 2.0–17.5% by weight of a rare earth element in terms of the amount of an oxide thereof and at most 0.3% by weight of Li, Na, K, Fe, Ca, Mg, Sr, Ba, Mn and B as impurity cationic elements in terms of total amount thereof, and having a thermal conductivity of at least 90 W/m·K.

13. A press-contacted body, which comprises a heat-generating part which is press-contacted to a heat-radiating plate consisting of a high thermal conductive silicon nitride sintered body containing 2.0–17.5% by weight of a rare earth element in terms of the amount of an oxide thereof, comprising a silicon nitride crystal and a grain boundary phase, and having the ratio of a crystal compound phase formed in said grain boundary phase to said entire grain boundary phase of at least 20% and a thermal conductivity of at least 90 W/m·K.

14. The press-contacted body according to claim 12 wherein the three-point bending strength of the high thermal conductive silicon nitride sintered body is at least 650 MPa.

15. The press-contacted body according to claim 12 wherein a surface roughness of a press-contact surface of a high thermal conductive silicon nitride sintered body press-contacted to the heat-generating part is at most 10 μm with reference to a maximum height (Rmax).

16. The press-contacted body according to claim 12 wherein the high thermal conductive silicon nitride sintered body comprises a silicon nitride crystal and a grain boundary phase, and the ratio of a crystal compound phase in said grain boundary phase to said entire grain boundary phase is at least 50%.

17. The high thermal conductive silicon nitride sintered body according to claim 2, wherein the rare earth element is a lanthanoid.

18. The high thermal conductive silicon nitride sintered body according to claim 3, wherein the rare earth element is a lanthanoid.

19. The high thermal conductive silicon nitride sintered body according to claim 2, containing at most 1.0% by weight of aluminum in terms of the amount of alumina.

20. The high thermal conductive silicon nitride sintered body according to claim 3, containing at most 1.0% by weight of aluminum in terms of the amount of alumina.

21. The high thermal conductive silicon nitride sintered body according to claim 2, containing at most 1.0% by weight of aluminum nitride.

22. The high thermal conductive silicon nitride sintered body according to claim 3, containing at most 1.0% by weight of aluminum nitride.

23. The high thermal conductive silicon nitride sintered body according to claim 2, containing 0.1–3.0% by weight of at least one element selected from the group consisting of Ti, Zr, Hf, V, Nb, Ta, Cr, Mo and W in terms of the amount of an oxide thereof.

24. The high-thermal conductive silicon nitride sintered body according to claim 3, containing 0.1–3.0% by weight of at least one element selected from the group consisting of Ti, Zr, Hf, V, Nb, Ta, Cr, Mo and W in terms of the amount of an oxide thereof.

25. The high thermal conductive silicon nitride sintered body according to claim 2, having a porosity of at most 2.5% by volume, a thermal conductivity of at least 80 W/m·k, and a three-point bending strength of at least 650 mPa at a room temperature.

26. The high thermal conductive silicon nitride sintered body according to claim 3, having a porosity of at most 2.5% by volume, a thermal conductivity of at least 80 W/m·k, and a three-point bending strength of at least 650 mPa at a room temperature.

27. The press-contacted body according to claim 13, wherein the three-point bending strength of the high thermal conductive silicon nitride sintered body is at least 650 mPa.

28. The press-contacted body according to claim 13, wherein the surface roughness of the press-contact surface of the high thermal conductive silicon nitride sintered body press-contacted to the heat-generating part is at most 10 μm with reference to a maximum height (Rmax).

29. The press-contacted body according to claim 13, wherein the high thermal conductive silicon nitride sintered body comprises a silicon nitride crystal and a grain boundary phase, and the ratio of a crystal compound phase in said grain boundary phase to said entire grain boundary phase is at least 50%.

* * * * *